(12) United States Patent
Daughton et al.

(10) Patent No.: US 7,148,531 B2
(45) Date of Patent: Dec. 12, 2006

(54) MAGNETORESISTIVE MEMORY SOI CELL

(75) Inventors: James M. Daughton, Eden Prairie, MN (US); James G. Deak, Eden Prairie, MN (US); Arthur V. Pohm, Ames, IA (US)

(73) Assignee: NVE Corporation, Eden Prairie, MN (US)

( * ) Notice: Subject to any disclaimer, the term of this patent is extended or adjusted under 35 U.S.C. 154(b) by 19 days.

(21) Appl. No.: 11/116,874

(22) Filed: Apr. 28, 2005

(65) Prior Publication Data

US 2005/0242382 A1  Nov. 3, 2005

Related U.S. Application Data

(60) Provisional application No. 60/566,249, filed on Apr. 29, 2004.

(51) Int. Cl.
*H01L 29/76* (2006.01)

(52) U.S. Cl. ............... 257/295; 257/421; 257/E27.104; 257/E29.164; 257/E21.664; 257/E21.208

(58) Field of Classification Search ............... 257/295, 257/421, E27.104, E29.164, E21.664, E21.208
See application file for complete search history.

(56) References Cited

U.S. PATENT DOCUMENTS

| | | | |
|---|---|---|---|
| 4,771,347 A | 9/1988 | Horimai et al. |
| 4,780,848 A | 10/1988 | Daughton et al. |
| 4,945,397 A | 7/1990 | Schuetz |
| 5,636,159 A | 6/1997 | Pohm |
| 5,841,692 A | 11/1998 | Gallagher et al. |
| 5,936,293 A | 8/1999 | Parkin |
| 6,385,082 B1 | 5/2002 | Abraham et al. |
| 6,535,416 B1 | 3/2003 | Daughton et al. |

(Continued)

OTHER PUBLICATIONS

J. Daughton and A. Pohm, "Design of Curie Point Written MRAM Cells". *J. Applied Physics*, 93, No. 10, p. 7304 (2003).

(Continued)

*Primary Examiner*—Nathan J. Flynn
*Assistant Examiner*—Tan Tran
(74) *Attorney, Agent, or Firm*—Kinney & Lange, P.A.

(57) ABSTRACT

A ferromagnetic thin-film based digital memory having a substrate formed of a base supporting an electrically insulating material primary substrate layer in turn supporting a plurality of current control devices each having an interconnection arrangement with each of said plurality of current control devices being separated from one another by spacer material therebetween and being electrically interconnected with information storage and retrieval circuitry. A plurality of bit structures are each supported on and electrically connected to a said interconnection arrangement of a corresponding one of said plurality of current control devices and have magnetic material films in which a characteristic magnetic property is substantially maintained below an associated critical temperature above which such magnetic property is not maintained of which two are separated by at least one intermediate layer of a nonmagnetic material having two major surfaces on opposite sides thereof. A plurality of word line structures located across from a corresponding one of the bit structures on an opposite side of the intermediate layer of a corresponding one of said bit structures from its interconnection arrangement supporting that bit structure. Sufficient electrical current selectively drawn through each of these bit structures as interconnected can cause substantial heating of that bit structure to raise temperatures thereof to have at least one of the magnetic material films therein at least approach its corresponding associated critical temperature while being substantially above temperatures of at least an adjacent said bit structure because of sufficient thermal isolation.

27 Claims, 11 Drawing Sheets

U.S. PATENT DOCUMENTS

| | | |
|---|---|---|
| 6,538,919 B1 | 3/2003 | Abraham et al. |
| 6,674,664 B1 | 1/2004 | Pohm |
| 6,744,086 B1 | 6/2004 | Daughton et al. |
| 6,771,534 B1 | 8/2004 | Stipe |
| 6,777,730 B1 | 8/2004 | Daughton et al. |
| 6,963,098 B1 | 11/2005 | Daughton et al. |
| 2001/0019461 A1 | 9/2001 | Allenspach et al. |

OTHER PUBLICATIONS

R.S. Beech, J.A. Anderson, A.V. Pohm and J.M. Daughton, "Curie Point Written Magnetoresistive Memory". *J. Applied Physics*, 87, No. 9, pp. 9403-9405 (2000).

MAGNETORESISTIVE MEMORY SOI CELL

CROSS-REFERENCE TO RELATED APPLICATION

This application claims the benefit of Provisional Application No. 60/566,249 filed Apr. 29, 2004 for "MAGNETORESISTIVE MEMORY SOI CELL".

BACKGROUND OF THE INVENTION

The present invention relates to ferromagnetic thin-film structures exhibiting relatively large magnetoresistive characteristics and, more particularly, to such structures used for the storage and retrieval of digital data.

Many kinds of electronic systems make use of magnetic devices including both digital systems, such as memories, and analog systems such as magnetic field sensors. Digital data memories are used extensively in digital systems of many kinds including computers and computer systems components, and digital signal processing systems. Such memories can be advantageously based on the storage of digital symbols as alternative states of magnetization in magnetic materials provided in each memory storage cell, the result being memories which use less electrical power and do not lose information upon removals of such electrical power.

Such memory cells, and magnetic field sensors also, can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a small memory cell can lead to the occurrence of vortices and demagnetization effects which can cause instabilities in the magnetization state desired in such a cell.

These magnetic effects between neighbors in an array of closely packed ferromagnetic thin-film memory cells can be ameliorated to a considerable extent by providing a memory cell based on an intermediate separating material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This result is considerably enhanced by choosing the separating material in the ferromagnetic thin-film memory cells to each be sufficiently thin within limits.

Operating magnetic fields imposed externally can be used to vary the angle of the magnetization vector in such a film with respect to the easy axis of that film. Such an axis comes about in the film because of an anisotropy therein typically resulting from either (a) depositing the film during fabrication in the presence of an external magnetic field oriented in the plane of the film along the direction desired for the easy axis in the resulting film, or by (b) selecting the shape of the film favoring the magnetization thereof to lie along a preferred direction, or both. During subsequent operation of devices having this resulting film, such operational magnetic fields imposed externally can be used to vary the angle to such an extent as to cause switching of the film magnetization vector between two stable states which occur for the magnetization being oriented in opposite directions along the film's easy axis. The orientation of the magnetization vector in such a film can be measured, or sensed, by the change in resistance encountered by current directed through this film portion, and so the magnetization state of a memory cell with such a film can be thereby determined. This arrangement has provided the basis for a ferromagnetic, magnetoresistive anisotropic thin-film to serve as a memory cell.

In the recent past, reducing the thicknesses of the ferromagnetic thin-films and the intermediate layers in extended "sandwich" structures, and adding possibly alternating ones of such films and layers, i.e. superlattices, have been shown to lead to a "giant magnetoresistive effect" being present in some circumstances. This effect yields a magnetoresistive response which can be in the range of up to an order of magnitude or more greater than that due to the well known anisotropic magnetoresistive response.

The giant magnetoresistive effect involves a change in the electrical resistance of the structure thought to come about from the passage of conduction electrons between the ferromagnetic layers in the "sandwich" structure, or superlattice structure, through the separating nonmagnetic layers with the resulting scattering occurring at the layer interfaces, and in the ferromagnetic layers, being dependent on the electron spins. The magnetization dependant component of the resistance in connection with this effect varies as the sine of the absolute value of half the angle between the magnetization vectors in the ferromagnetic thin-films provided on either side of an intermediate nonmagnetic layer. The electrical resistance in the giant magnetoresistance effect through the "sandwich" or superlattice structure is lower if the magnetizations in the separated ferromagnetic thin-films are parallel and oriented in the same direction than it is if these magnetizations are antiparallel, i.e. oriented in opposing or partially opposing directions.

A memory cell based on the "giant magnetoresistive effect" can be provided through having one of the ferromagnetic layers in the "sandwich" construction prevented from switching the magnetization direction therein away from pointing along its initial easy axis direction to pointing in the opposite direction as the result of applying suitable external magnetic fields but also, in contrast, permitting the remaining ferromagnetic layer in the "sandwich" to be free to do change direction as a result of the same externally applied fields. In one such arrangement, a "spin-valve" structure is formed by providing an antiferromagnetic layer on the ferromagnetic layer that is to be prevented from switching in the externally applied fields to "pin" its magnetization direction in a selected direction. In an alternative arrangement often termed a "pseudo-spin valve" structure, the ferromagnetic layer that is to be prevented from switching in the externally applied fields is made sufficiently thicker than the free ferromagnetic layer so that it does not switch in those external fields provided to switch the free layer.

Thus, a digital data memory cell based on the use of structures exhibiting the giant magnetoresistive effect is attractive as compared to structures based on use of an anisotropic magnetoresistive effect because of the larger signals obtainable in information retrieval operations with respect to such cells. Such larger magnitude signals are easier to detect without error in the presence of noise thereby leading to less critical requirements on the retrieval operation circuitry.

An alternative digital data bit storage and retrieval memory cell suited for fabrication with submicron dimensions can be fabricated that provides rapid retrievals of bit data stored therein and low power dissipation memory through use of a cell structure that has a spin dependent tunneling junction (SDTJ), or magnetoresistive tunnel junction (MTJ), device therein based on a pair of ferromagnetic thin-film layers having an electrical insulator layer therebetween of sufficient thinness to allow tunneling currents therethrough. This memory cell can be fabricated using ferromagnetic thin-film materials of similar or different kinds in each of the magnetic memory films present in such a "sandwich" structure on either side of an intermediate nonmagnetic layer where such ferromagnetic films may be composite films, but this intermediate nonmagnetic layer conducts electrical current therethrough based primarily on the quantum electrodynamic effect "tunneling" current mentioned above.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers, the latter being set by the layer magnetization directions to provide a "magnetic valve effect". Such an effect results in an effective resistance or conductance characterizing this intermediate layer with respect to the "tunneling" current therethrough. In addition, an antiferromagnetic layer against one of the ferromagnetic layers is used in such a cell to provide different magnetization switching thresholds between that ferromagnetic layer and the other by fixing, or "pinning", the magnetization direction for the adjacent ferromagnetic layer while leaving the other free to respond to externally applied fields. Such devices may be provided on a surface of a monolithic integrated circuit to thereby allow providing convenient electrical connections between each such memory cell device and the operating circuitry therefor.

A "sandwich" structure for such a memory cell, based on having an intermediate thin layer of a nonmagnetic, dielectric separating material with two major surfaces on each of which a anisotropic ferromagnetic thin-film is positioned, exhibits the "magnetic valve effect" if the materials for the ferromagnetic thin-films and the intermediate layers are properly selected and have sufficiently small thicknesses. The resulting "magnetic valve effect" can yield a response which can be several times in magnitude greater than that due to the "giant magnetoresistive effect" in a similar sized cell structure.

As stated above, operating magnetic fields imposed externally can be used to vary the angle of the magnetization vector with respect to the easy axis in the ferromagnetic films of these various kinds of memory cell devices, particularly the free layers. Such operational magnetic fields imposed externally can be used to vary the angle to such an extent as to cause switching of the layer magnetization vector between two stable states which occur for the magnetization being oriented in opposite directions along the easy axis of the layer, the state of the cell determining the value of the binary bit being stored therein. One of the difficulties in such memories is the need to provide memory cells therein that have extremely uniform switching thresholds and adequate resistance to unavoidable interjected magnetic field disturbances in the typical memory cell state selection scheme used. This externally applied operating fields scheme is based on selective externally imposed magnetic fields provided by selectively directing electrical currents over or through sequences of such cells thereby giving rise to such magnetic fields so that selection of a cell occurs through coincident presences of such fields at that cell.

In such a coincident current selection arrangement, only that cell in the vicinity of the crossing location, or intersection, of these two paths (one over a sequence of cells and the other through another sequence of cells) experience sufficient magnetic field intensities because of the summing of the fields due to these two currents to cause such a magnetic state change therein. Cells in the array that are located far away from both of these two current paths are not significantly affected by the magnetic fields generated by such currents in the paths because such fields diminish in intensity with distance from the source thereof. Cells, however, located in relatively close proximity to one, but not two, of these two paths do experience more significant magnetic fields thereabout, and those immediately in or adjacent to one such path experience sufficient field intensities to be considered as being "half-selected" by the presence of current in that path intended to participate in fully selecting a different cell along that path at the intersection with the other path on which a selection current is present. Half-selection means that a bit is affected by magnetic fields from the current through one path but not another. Such a coincident interjected magnetic fields memory cell state selection scheme is very desirable in that an individual switch, such as that provided by a transistor, is not needed for every memory cell, but the limitations this selection mode imposes on the uniformity of switching thresholds for each memory cell in a memory make the production of memory chips in integrated circuit wafers with high yields difficult.

As such magnetic thin-film memory cells are made smaller to thereby increase the cell density over the surface of the substrate on which they are disposed, the resulting cells become more subject to magnetic state, or data, upsets due to thermal fluctuations occurring in the materials therein. The depth of the energy well in the magnetic material of such cells can be approximated as $H_{weff}*M_s*$Volume, where $H_{weff}$ is half the effective restoration magnetic field attempting to maintain the current magnetic state following perturbations thereto and so effectively providing the energy well depth, $M_s$ is the saturation magnetization of the magnetic material in the cell, and Volume is the volume of the magnetic material in the cell. In conventional cells, $H_{weff}$ is provided by shape anisotropy or anisotropy due to the material properties of the cell magnetic material, or both. Typically, the value of $H_{weff}$ in these cells is less than 100 Oe.

The important factor is the smallest energy well depth for a memory cell during memory chip operation, which often is that of a half-selected cell. The design objective is to ensure that the memory cells are magnetically stable during the data storing, or magnetic state switching, procedure that is repeatedly undertaken with respect to other cells. However, the trade-off between thermal stability and magnetic stability is a serious problem when the total magnetic volume of bits is less than about $10^5$ nm$^3$. Although the required barrier energy to be thermally stable can be reduced by use of error correction and periodic retrievals with corresponding corrections of the data stored in the whole memory, such a memory takes additional chip area and increased processing steps thereby increasing costs and reducing operating rapidity.

Meeting the thermal stability requirement of maintaining the same energy well depth for thermal stability in scaled down area memory cells necessitates the thickness of the resulting free layer being increased. Then the total anisotropy field correspondingly increases and so the required sense line current through the cell increases and the required word line current adjacent the cell increases to be capable of switching the magnetization direction of the free layer. This in turn causes the current density in the sense line to increase and temperature to rise in the line. These results show the very dramatic increase in current density as cells are reduced in width so that electromigration in the current conductors along with heating must be considered.

As indicated above, a ferromagnetic layer and an antiferromagnetic layer can be deposited in succession so they are in contact with one another with the result that relatively large interatomic forces occur aligning electron spins (parallel for ferromagnetism and antiparallel for antiferromagnetism). These coupling forces at the interface between these layers can be such that the magnetization of the ferromagnetic layer is restored to its initial direction prior to being subjected to external magnetic fields even after very large external magnetic fields are subsequently applied thereto. Such external magnetic fields can be 1000 Oe or more, and the magnetization of the ferromagnetic layer will still be restored to its initial direction. Thus, if such an antiferromagnetic layer is provided in contact with a ferromagnetic layer in a memory cell so that relatively large coupling occurs therebetween, the energy well depth for a small memory cell can be greatly increased. Such an arrangement can increase the potential density of memory cells by more than a factor of 10 through permitting the cell dimensions to go from about 0.2 µm minimum dimensions to approximately 0.05 µm dimensions.

A film structure which exhibits even better resistance to the effects of large externally applied magnetic fields is provided by a compound ferromagnetic thin-film layer with an antiferromagnetic layer. This compound ferromagnetic thin-film layer is provided to have a net layer magnetization that, when fixed in orientation in the finally formed structure, will resist rotation of its magnetization so that the magnetization of this compound ferromagnetic thin-film layer will appear fixed in its orientation in the device, i.e. "pinned" in a direction relative to the finally formed structure.

This compound ferromagnetic thin-film layer is formed by depositing a ferromagnetic layer in the presence of an easy axis direction determination magnetic field, then a nonmagnetic layer of ruthenium (no orienting magnetic field needed in this instance) to provide a very thin ruthenium antiferromagnetic coupling layer. Thereafter, another ferromagnetic layer is deposited again in the presence of an easy axis direction determination magnetic field aligned as was the field for the first ferromagnetic layer. The resulting compound ferromagnetic layer has materials with high spin polarization in its outer layers due to the use of high magnetic induction ferromagnetic material therein, but has little net magnetic moment because of the ruthenium layer provided therebetween which strongly antiferromagnetically couples these outer layers through primarily exchange coupling (some magnetostatic coupling also present)so that the magnetizations of each are pointed in opposite directions. Thus, this layer is relatively insensitive to externally applied fields and contributes little to the spatial fields thereabout. However, the magnetization direction in this composite layer by itself is not very strongly fixed in any direction because of the relatively weak anisotropy exhibited by the ferromagnetic layers.

Thus, a further antiferromagnetic material "pinning" layer exhibiting a substantial magnetic anisotropy must be deposited on the last ferromagnetic layer in the presence of a magnetization axis determination magnetic field aligned with the fields used in forming the two ferromagnetic layers to strongly set the magnetization direction of the compound layer. Such an antiferromagnetic layer has a strongly fixed magnetization direction which, through exchange coupling to the last ferromagnetic layer on which it is deposited, strongly fixes the direction of magnetization of that layer also, and so that of the first ferromagnetic layer through the ruthenium layer. The result is an antiferromagnetic layer coupled strongly to the compound layer together forming a "synthetic antiferromagnet".

The magnetic fields necessary to reach the cell switching thresholds to cause switching magnetization directions of the relatively fixed magnetization orientation layers among the cell magnetic layers for memory cells of smaller and smaller lengths and widths to thereby change the data stored therein have, of course, magnitudes beyond those of the fields required to switch the magnetization directions in the free layers of those cells. The fields required to change the magnetization directions in these free layers also increase for smaller cells as shown above. Generating such magnetic fields begins to require currents through such cells and associated word lines of magnitudes that result in current densities sufficient to cause significant electromigration of the conductive materials and operating temperature rises of the cell region which will alter device behavior and structure. Such effects thereby lead to a limit of some minimum size for these cells.

One possibility for avoiding such limits has been found through allowing memory cell device operating temperature increases due to heating because of supplying word line currents adjacent to, and sense currents in, memory cells sufficient to approach or exceed the Curie temperature of one or more ferromagnetic layers in memory cells without a "pinning" layer or layers therein, or to approach or exceed the blocking temperature of the antiferromagnetic "pinning" layer in cells having such a layer. Such word line and sense line current based temperature increases permit storage of information in those cells to be achieved without reaching current magnitudes otherwise necessary to switch the magnetization directions of the ferromagnetic layers. The direction of magnetization of the relatively fixed magnetization orientation layer such as the thicker ferromagnetic layer in a three layer "sandwich" structure can be selected by having a moderate magnetic field present oriented in the selected direction when the layer cools sufficiently below its Curie temperature for cells without a "pinning" layer present, or by a field sufficient to set the direction of the ferromagnetic layer adjacent an antiferromagnetic "pinning" layer when that "pinning" layer cools sufficiently below its blocking temperature for cells using such a "pinning" layer or, alternatively, a "pinning" layer composite. The blocking temperature of an antiferromagnetic layer is the temperature at or above which that layer loses its ability to "pin" the magnetization direction of an adjacent ferromagnetic layer below its Curie temperature which blocking temperature is usually less than the Néel temperature of that layer. Similarly, the Curie temperature may not need to be fully reached to allow relatively easy reorienting of the magnetization direction therein.

A similar scheme would apply if pinning through providing an antiferromagnetic layer were used instead, and the critical temperature would then be the Néel temperature of the antiferromagnet. In an antiferromagnet, the ordering of magnetic moments of adjacent atoms are in opposite directions so that the net magnetic moment is zero or near zero. When an antiferromagnetic layer and a ferromagnetic layer are sputtered as sequential layers, the antiferromagnetic layer as indicated above can effectively pin the magnetization of the ferromagnetic layer with an effective field of thousands of Oersteds. This pinning field is used in the case of Néel point data storage to provide the stability of the cell. As the cell is cooled to below the Néel temperature, a small magnetic field is adequate to write the cell into the desired memory state.

Reducing the magnitudes of currents necessary for causing the harder ferromagnetic layer in memory cells, with or without a "pinning" layer, to approach or reach its Curie temperature, or the antiferromagnetic layer in memory cells with a "pinning" layer arrangement to approach or reach its blocking temperature, and insulating such memory cells from their neighboring cells to provide good cell selectivity in storing information requires providing some thermal isolation of each cell from its neighbors and the integrated circuit substrate or any other kind of substrate serving as a heat sink. Such thermal isolation can be provided by use of electrical conductive interconnections that are of a relatively low thermal conductivity, and by supporting the memory cell on an electrical insulator of relatively low thermal conductivity.

As stated above, operating magnetic fields imposed externally by providing electric currents through both the sense line in which a cell is connected and through the word line adjacent to the cell can be used to vary the angle of the magnetization vector with respect to the easy axis in the ferromagnetic films of these various kinds of memory cell devices. The various magnetoresistive memory cell types thus use a coincident interjected magnetic fields memory cell state selection scheme for retrieving stored data. Such magnetic selection schemes for data retrievals introduce further data disturbance opportunities through again generating magnetic fields that can combine with unwanted magnetic fields that appear.

Electrical currents along the same conductors, but of increased magnitude, can also be used to heat the cell to provide for either Curie point or Néel point data storage in a coincident adjacent currents cell selection arrangement. In operation, each cell, when not to be selected for a state imposition therein, has no currents in the pair of sense line and word line conductors crossing in or adjacent to them or has current in only one of that pair. A selected cell, on the other hand, coincidently receives both of the corresponding currents along the two perpendicular sense and word lines crossing in or by it and is thereby heated into the desired condition to set a selected memory state by therein by magnetic fields generated by one of these currents kept though reduced following the heating. However, this arrangement dissipates heat along the entire sense line and along the entire word line carrying these currents to thereby result in substantial power dissipation and heating of otherwise unselected cells.

Another arrangement for selectively heating such a cell passes current through the cell under the control of some kind of current-pass or current-not-pass current controller (perhaps a simple switch) and a current carrying conductor positioned close to that cell which can also generate a magnetic field at the cell in a coincident cell switching and adjacent current cell selection arrangement. FIGS. 1 and 2 show monolithic integrated circuit chip fragmentary layer diagrams of two known kinds of thermally switched memory cell magnetic structures for use with transistor current controllers, these structures being a double magnetic tunnel junction structure in FIG. 1 and a multilayer vertical spin valve structure in FIG. 2 and can be found further described in earlier filed co-pending U.S. patent application by J. M. Daughton and A. V. Pohm entitled "Thermal Operated Switch Control Memory Cell" having Ser. No. 10/875,082 which is assigned to the same assignee as the present application and is hereby incorporated herein by reference. These layer diagrams give indications of the structural layers leading to the structural portion shown in FIGS. 1 and 2, but they are not true cross section views in that many dimensions there are exaggerated or reduced relative to one another for purposes of clarity.

As can be seen in FIGS. 1 and 2, the memory cell structures are provided on a semiconductor material monolithic integrated circuit chip serving as a substrate therefor and having electronic circuit component devices provided in the semiconductor material, 10, thereof in also serving as the substrate for the remaining portions of the integrated circuit itself. Those remaining portions of the monolithic integrated circuit shown in FIGS. 1 and 2 above the semiconductor material 10 which includes a series of four electrical insulating layers, $10'$, $10''$, $10'''$, $10^{iv}$. Each of the lower three of these electrical insulating layers have a metal circuit interconnection pattern supported thereon for electrically interconnecting selected ones of the circuit component devices therebelow in semiconductor material 10 and the integrated "sandwiches" tunneling or spin valve devices provided thereabove. Following chemical and mechanical polishing of the surface of last or uppermost electrical insulating layer $10^{iv}$, and the opening of vias therein to provide metal interconnections to the interconnection layer therebelow, a further electrical insulating layer, 11, is formed on the resulting surface following the providing of such interconnections.

These integrated "sandwiches" tunneling devices in FIG. 1, or spin valve devices in FIG. 2, are next provided by a series of layer sputter depositions with portions of these deposited layers being later removed by ion milling to leave the desired device portions remaining on the upper surface of layer 11. There they are surrounded by an insulating layer to thereby be formed, in effect, in a via in that insulating layer with the results therefor shown in the memory cell magnetic structures of FIGS. 1 and 2, and again in the corresponding insets in those figures which are enlarged for clarity. A first thermal resistance control and magnetic "pinning" via antiferromagnetic resistive material layer, 12, is on the exposed surface of an electrical interconnection extending through a via in layer 11 from the integrated circuitry in the substrate below. A further magnetic "pinning" via antiferromagnetic material layer, 12', provides a further portion of a synthetic antiferromagnet.

A via compound ferromagnetic thin-film and conductive thin-film layer combination is next formed having a net layer magnetization that, when fixed in a selected spatial orientation in the finally formed structure, will resist magnetization rotation, and certainly resist firmly any magnetization rotation therein that could be sufficient to lead to a reversal in its orientation as a result of expected externally applied magnetic fields. Thus, for the finally formed cell structures intended to be used in limited magnetic fields, the magnetization of this compound thin-film layer will appear fixed in its orientation in the device, i.e. "pinned" in a direction relative to the finally formed cell structure which will be in the planes of FIGS. 1 and 2. This compound thin-layer film is formed by a ferromagnetic material thin-film layer, 13', with an easy axis in the plane of the figures followed a nonmagnetic layer, 13", of ruthenium in turn followed by another ferromagnetic material layer, 13''', with an easy axis direction in the plane of the figures. The resulting compound layer 13', 13", 13''' has materials with high spin polarization in its outer layers due to the use of high magnetic induction ferromagnetic material therein, but has little total magnetic moment because of the Ru layer provided therebetween which strongly antiferromagnetically couples these outer layer through primarily exchange coupling so that the magnetizations of each are pointed in opposite directions. Thus, this layer is relatively insensitive to externally applied magnetic fields and contributes little to the spatial magnetic fields thereabout. However, the magnetization direction in this composite layer by itself is not very strongly fixed in any direction because of the relatively weak anisotropy exhibited by the ferromagnetic material layers, and so antiferromagnetic material "pinning" layers 12 and 12', exhibiting a substantial magnetic anisotropy, must be present to strongly set the magnetization direction of compound layer 13', 13", 13''' in the direction of the easy axis in the plane of the figures. Such a layer has a strongly fixed magnetization direction which, through exchange coupling to layer 13', strongly fixes the direction of magnetization of that layer also, and so that of layer 13''' through Ru layer 13".

The memory cells magnetic structures differ in the devices of FIGS. 1 and 2 for the next sequences of layers therein before another similar via synthetic antiferromagnet, having a second thermal resistance control and magnetic "pinning" via layer, is provided on the opposite end of these memory cell magnetic structures. The material constituents in this latter synthetic antiferromagnet in the cell of FIG. 2 are changed in proportions to provided it with a lower Néel temperature than the one already described above but which otherwise behaves similarly, whereas the two synthetic antiferromagnets in the cell of FIG. 1 are made in the same form and manner.

In the memory cell magnetic structure of FIG. 1, a via spin dependent tunneling layer or barrier layer, 14, as a first intermediate layer is provided as a very thin dielectric and represented as a solid line in the main portion of FIG. 1 but as a narrow open rectangle in the corresponding inset. Layer 14 is formed primarily of aluminum oxide.

A via ferromagnetic material thin-film layer, 15, is provided on the exposed surface of layer 14 as a magnetic "free layer" that can have its magnetization direction relatively easily altered by external applied magnetic fields. Layer 12 has a Curie temperature that relatively low in comparison with the ferromagnetic material layers and the antiferromagnetic material layers in the structure synthetic antiferromagnets.

A second via intermediate layer again furnished as a spin dependent tunneling layer or barrier layer, 16, is provided on layer 15, this barrier layer again being a very thin dielectric and represented as a solid line in the main portion of FIG. 1 but as a narrow open rectangle in the corresponding inset. Layer 16 is has the same form as barrier layer 14. Similarly, a ferromagnetic material layer, 17', is next provided in the form of layer 13', a ruthenium layer, 17", is then provided in the form of layer 13", and a further ferromagnetic material layer, 17''', is next provided in the form of layer 13''' as part of the second via antiferromagnet in the device. This is completed by providing a magnetic "pinning" via layer, 18, in the form of layer 12' and another, or second, thermal resistance control and magnetic "pinning" via layer, 18', provided in the form of layer 12 to complete the memory cell double spin dependent tunneling structure, 19, of FIG. 1 (after ion milling of the layers deposited to form this structure) and other such structures concurrently fabricated in the monolithic integrated circuit.

In the alternative for forming the memory cell magnetic structure for the cell of FIG. 2, thermal resistance control and magnetic "pinning" via layers 12 and 18' and magnetic "pinning" via layers 12' and 18 of FIG. 1 are again shown formed as described above but the remaining portions of the synthetic antiferromagnets of FIG. 1 are not shown provided in FIG. 2 thus resulting in weaker "pinning" of the adjacent ferromagnetic layers. This is a matter of choice in either of these figures made in consonance with the expected magnitudes of the externally applied fields so that layers 13', 13", 13''', 17', 17" and 17''' could be eliminated in the magnetic structure of FIG. 1, and corresponding layers 12", 12''', 12$^{iv}$, 18', 18" and 18''' (not shown) could be added in the magnetic structure of FIG. 2.

Instead, the designator 13 in the magnetic structure of FIG. 2, is used with a via alternating layers sequence formed on the higher Néel temperature antiferromagnet 12 in this FIG. 2 device having 20 Å thick ferromagnetic material layers, exemplified by layers 13', that are provided separated from one another by 10 Å thick layers of Cu, exemplified by layers 13", to thereby be tightly parallel coupled layers with a total thickness less than the spin flip length of electron spins. On the last in the sequence of ferromagnetic material layers 13' is provided a thicker via layer, 14, of Cu to a thickness of 30 Å on which is next provided an electrical resistance augmentation layer formed as a porous Cu via layer, 15, 10 Å thick. This layer is formed by sputter codepositing or alternately sputter depositing Cu and another material, such as aluminum or immiscible silicon, therewith and oxidizing the result to leave only copper filaments as the conductors.

The remainder of the magnetic structure in FIG. 2 outside the antiferromagnets therein is repeated in reverse order from layer 15 upward in that figure from the structure portion described above below that layer. Thus, a via Cu layer, 16, is provided on layer 15 in the form of layer 14, and is followed by a via alternating layers sequence marked using the designator 17 having 20 Å thick ferromagnetic material layers, exemplified by layers 17', that are provided separated from one another by 10 Å thick layers of Cu exemplified by layers 17". The lower Néel temperature antiferromagnet formed by magnetic "pinning" via layer 18 provided in the form of layer 12' and the second thermal resistance control and magnetic "pinning" via layer 18" provided in the form of layer 12 is formed on the alternating layers sequence exemplified by layers 17' and 17" to complete the memory cell multilayer vertical spin valve structure, 19', of FIG. 2 (after ion milling of the layers deposited to form this structure) and other such structures concurrently fabricated in the monolithic integrated circuit.

An electrical insulating material layer is provided around those structures 19 and 19' to form another insulating layer, 20, having those structures in effect in vias in this layer which layer could alternatively be of organic materials such as polyimide or B-staged bisbenzocyclobutene (BCB) which have thermal conductivities below those of commonly used electrical insulating materials in monolithic integrated circuits such as silicon dioxide or silicon nitride. A plurality of interconnections, 21, are provided for interconnecting memory cell structures 19 and 19' to the electronic circuitry in the integrated circuit therebelow through mating with metal interconnection risers extending through insulating layers of that integrated circuit. A further protective electrical insulating layer, 22, covers and protects metal interconnections 21. On insulating layer 22 a further plurality of interconnections, 23, are provided for word lines adjacent to, and over, memory cell structures 19 and 19' that are also connected to the electronic circuitry in the integrated circuit therebelow through mating with metal interconnection risers extending through insulating layers of that integrated circuit. Ferromagnetic material is provided as highly permeable ferromagnetic material cladding about interconnections 23 just in the immediate vicinity of structures 19 and 19' as magnetic field "keepers", 23', to more closely confine and enhance the magnetic fields there generated by those electrical currents selectively established during operations in interconnections 23. A further protective electrical insulating layer, 24, covers and protects interconnections 23 with claddings 23' thereon.

Interconnection 21 extending from memory cell 19 and 19' in FIGS. 1 and 2, respectively, and through insulating layer 20, meets an electrical interconnection riser on the left in those figures by having a portion thereof, 25, extend through silicon nitride layer 11 to reach a plug, 26, of tungsten and be in electrical contact therewith at the upper end of that riser. Plug 26 in turn extends through integrated circuit insulating layer $10^{iv}$ to reach and be in electrical contact with a portion, 27, of the third metal layer of that integrated circuit. This third metal portion is formed of primarily aluminum. A further aluminum plug, 25', extends from the bottom of the memory cell structure 19 in FIG. 1, and 19' in FIG. 2, through silicon nitride layer 11 to be in contact with a further tungsten plug, 26', extending through electrical insulating layer $10^{iv}$ to be in contact with another third metal layer interconnection portion, 27'.

Third metal layer interconnection portion 27 in FIGS. 1 and 2 is in contact with a further tungsten plug, 29, extending through electrical insulating layer 10''' to reach a portion, 30, of the aluminum second metal layer in the integrated circuit. Second metal layer portion 30 is in contact with a further tungsten plug, 31, which extends through electrical insulating layer 10'' of the integrated circuit to a portion, 32, of the aluminum first metal layer of the integrated circuit.

Third metal layer interconnection portion 27' in FIGS. 1 and 2 is in contact with a further tungsten plug, 29', extending through electrical insulating layer 10''' to reach another portion, 30', of the aluminum second metal layer in the integrated circuit. Second metal layer portion 30' is in contact with a further tungsten plug, 31', which extends through electrical insulating layer 10'' of the integrated circuit to another portion, 32'', of the aluminum first metal layer of the integrated circuit.

First metal layer portion 32 is in contact with a final tungsten plug, 33, extending through electrical insulating layer 10' of the integrated circuit to reach semiconductor material 10 of that integrated circuit, specifically, to be electrically connected to one of the terminating regions, 34, of a metal-oxide-semiconductor field-effect transistor (MOSFET), 35. Terminating region 34 of transistor 35 is formed of an $n^+$-type conductivity material formed in a p-type conductivity material tub, 36, in n-type conductivity semiconductor material 10. Transistor 35 has a further $n^+$-type conductivity material terminating region, 37, formed in p-type conductivity material tub 36. In addition, transistor 35 has an $n^+$-type conductivity polysilicon gate, 38, between terminating regions 34 and 37 separated from tub 36 by a thin gate oxide, 39.

Terminating region 37 has a tungsten plug, 33', extending through electrical insulating layer 10' of the integrated circuit to reach another portion, 32', of the first metal layer of the integrated circuit. In a typical arrangement, first metal layer portion 32' extends to a pad suited for connection to a positive source of voltage, with third metal layer portion 28 connected to a ground reference voltage. In this situation, terminating region 37 serves as a drain for transistor 35 and terminating region 34 serves as a source for transistor 35. If the polarity of the voltage between first metal interconnection layer portion 32' and third metal layer interconnection portion 28 are reversed, terminating region 34 would then serve as the drain for transistor 35 and terminating region 37 would serve as the source. In either situation, memory cell structure 19 and 19' in FIGS. 1 and 2, respectively, will have current provided therethrough controlled by transistor 35, and perhaps by others not shown in this figure.

First metal layer portion 32'' is in contact with a final tungsten plug, 33'', extending through electrical insulating layer 10' of the integrated circuit to reach semiconductor material 10 of that integrated circuit, specifically, to be electrically connected to one of the terminating regions, 34', of another MOSFET, 35'. Terminating region 34' of transistor 35' is formed of an $n^+$-type conductivity material formed in a p-type conductivity material tub, 36', in n-type conductivity semiconductor material 10. Transistor 35' has a further $n^+$-type conductivity material terminating region, 37', formed in p-type conductivity material tub 36'. In addition, transistor 35' has an $n^+$-type conductivity polysilicon gate, 38', between terminating regions 34' and 37' separated from tub 36' by a thin gate oxide, 39'.

Terminating region 37' has a tungsten plug, 33''', extending through electrical insulating layer 10' of the integrated circuit to reach another portion, 32''', of the first metal layer of the integrated circuit. In atypical arrangement, first metal layer portion 32''' extends to a pad suited for connection to a positive source of voltage. In this situation, terminating region 37' serves as a drain for transistor 35' and terminating region 34' serves as a source for transistor 35'.

When electrical currents are selected to be established in memory cell structures 19 and 19' through control of transistors 35 and 35', the corresponding power dissipated therein will the temperatures of those cells to rise which can be sufficient to approach or exceed the Curie temperature of the ferromagnetic layers in the memory cells without a "pinning" layer or layers therein, or to approach or exceed the blocking temperature or the higher Néel temperature of the antiferromagnetic "pinning" layer in cells having such a layer. Such temperatures, as indicated above, can permit storage of information in those cells to be achieved without reaching current magnitudes otherwise necessary to switch the magnetization directions of the ferromagnetic layers.

However, there are two primary heat flow paths at each memory cell that allow heat to escape from the cell thus making more difficult the raising of the cell temperature to such magnitudes. One is the flow of heat from the cell into the surrounding electrical insulating material which is limited by the use of low thermal conductivity insulating materials such as organic materials as indicated above. The other is the flow of heat from the cell through the thermal flow resistant antiferromagnetic materials in layers 12 and 18' on opposite sides of those cells which will be at or slightly above the temperature of the integrated circuit substrate. Thus, there is a desire to find supplementary arrangements along with passing electrical current through the cells to ease the raising of the temperatures thereof when selected for storing information therein.

BRIEF SUMMARY OF THE INVENTION

The present invention provides a ferromagnetic thin-film based digital memory having a substrate formed of a base supporting an electrically insulating material primary substrate layer in turn supporting a plurality of current control devices each having an interconnection arrangement with each of said plurality of current control devices being separated from one another by spacer material therebetween and being electrically interconnected with information storage and retrieval circuitry. A plurality of bit structures are each supported on and electrically connected to a said interconnection arrangement of a corresponding one of said plurality of current control devices and have magnetic material films in which a characteristic magnetic property is substantially maintained below an associated critical temperature above which such magnetic property is not maintained of which two are separated by at least one intermediate layer of a nonmagnetic material having two major surfaces on opposite sides thereof. There is also a plurality of word line structures each located across from a corresponding one of the bit structures on an opposite side of the intermediate layer of a corresponding one of said bit structures from the interconnection arrangement supporting that bit structure. The information storage and retrieval circuitry can draw a sufficient electrical current selectively through each of these bit structures, that said interconnection arrangement providing support thereto and that said one of said plurality of current control devices from which that said interconnection structure portion extends to thereby cause substantial heating of that bit structure to raise temperatures thereof to have at least one of the magnetic material films therein at least approach its corresponding associated critical temperature while being substantially above temperatures of at least an adjacent said bit structure because of sufficient extent of, and smallness of thermal conductivities of, at least portions of said selected bit structure and of those portions of said primary substrate layer and said spacer material positioned thereabout.

Low thermal diffusivity material layer can be used to couple the magnetic material films to the interconnection structure portion, and such a layer can also be provided on an opposite side of the intermediate layer to couple the magnetic material films to another interconnection structure or to the corresponding word line. In the latter arrangement, magnetic material cladding of the word line can be extended to magnetically shield the bit structure formed in conjunction with the intermediate layer therein. In addition, a thermistor material layer can be provided between the low thermal diffusivity material layers.

DETAILED DESCRIPTION

The implementation of magnetoresistive memory cells using thermally assisted data storage arrangements can require operation thereof in relatively difficult environments. The maximum temperature rise required in some possible implementations is about 200° C. This total required temperature rise is due to the difference between the ambient temperature of the chip and the maximum temperature required to disrupt the magnetic ordering occurring in the cell magnetic material at lower temperatures. The minimum ambient temperature could be 0° C., or even colder, in some situations in which the memory cells are required to operate, and if the maximum order disruption temperature of the material is 200° C., then the total temperature rise needed to be caused by the establishment heating currents through the cells would have to be at least 200° C. This magnitude of needed cell temperature increases for the storage of data therein is difficult to obtain with a fast rise time, realizable electrical resistance values in the cell materials and structure, while using a current control transistor in series with the cell that is of a minimum transistor size. If the thermal rise required from such cell currents could be reduced by also using the elevated temperature reached by the series cell selection transistor (or diode in an alternative current control circuit) to heat the corresponding cell, the cell heating rate could be increased, and the control transistor size and required cell resistance could be decreased.

Figure 1:
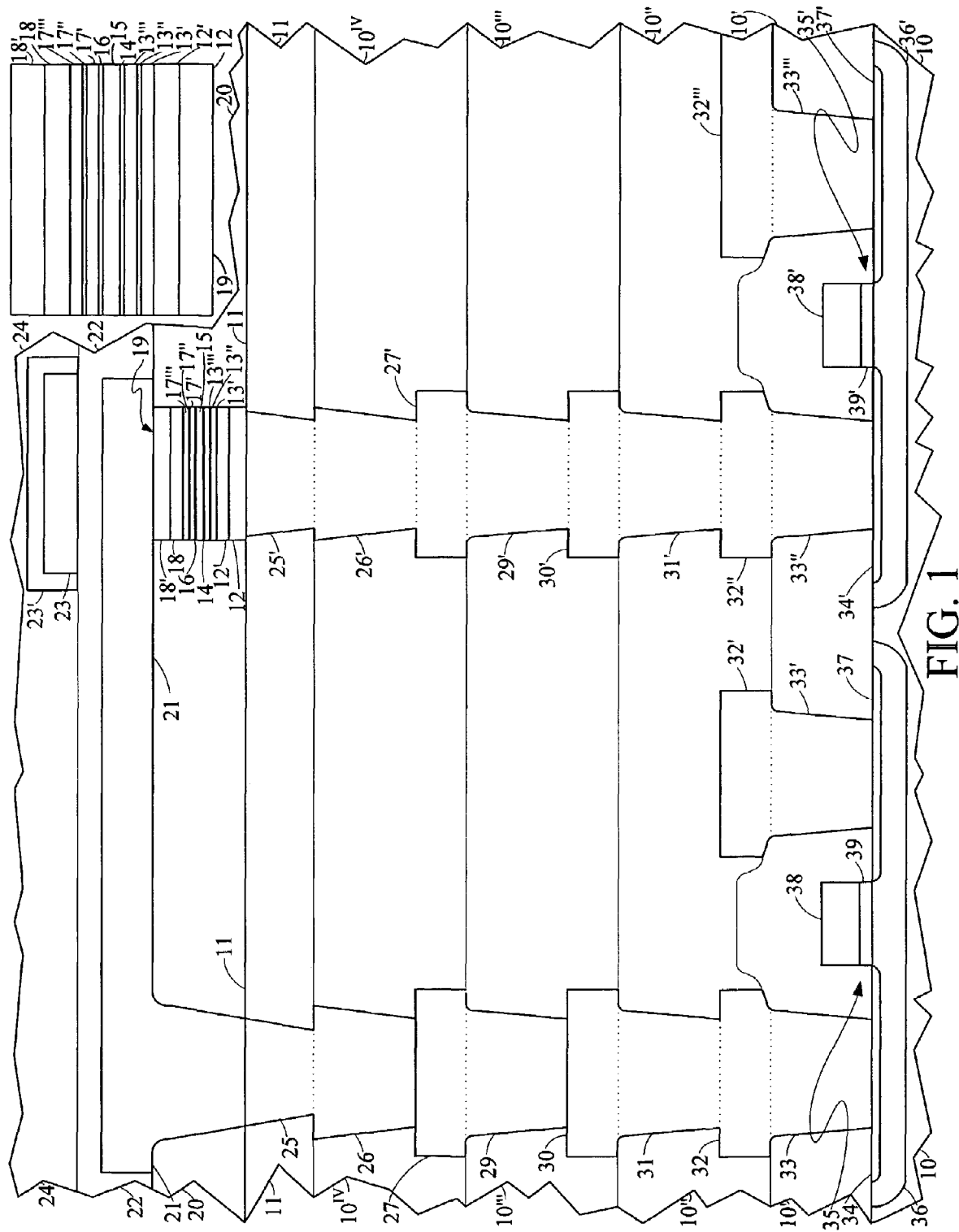
FIGS. 1 and 2 show layer diagrams of alternative memory cells in an integrated circuit cell control configuration.
Figure 2:
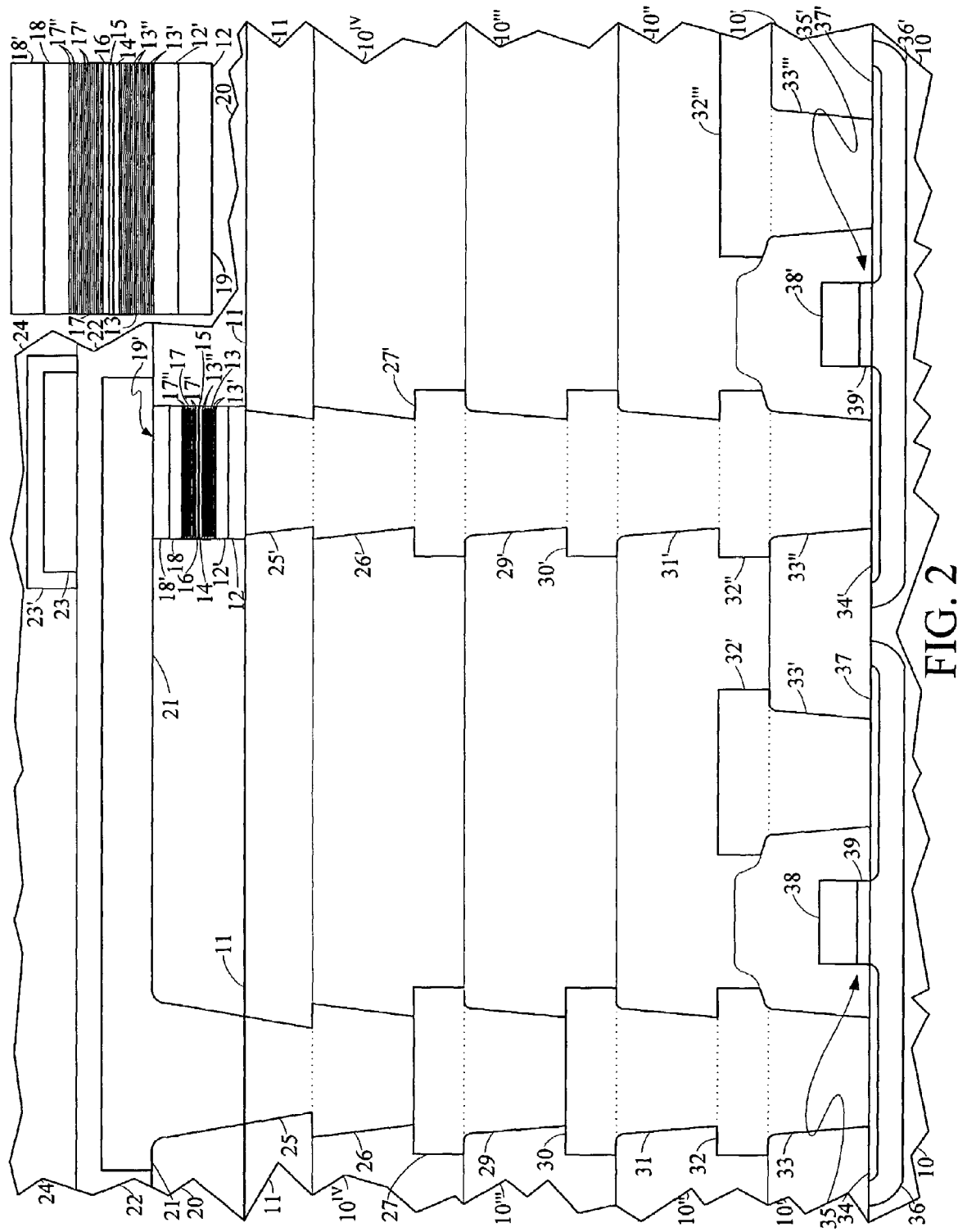

However, the configurations shown in FIGS. 1 and 2 for operating memory cell structures 19 and 19', respectively, rely on cell current control transistors such as transistor 35 that are embedded in silicon substrate 10. Any electrical power dissipation in those transistors (or substrate based diodes in alternative current control circuits) raising the temperature thereof does not contribute significantly to raising the temperature of the corresponding memory cell structure as substrate 10 serves as a heat sink.

The temperature increases in the current control selection transistor or diode for a corresponding memory cell structure, on the other hand, can be used to increase the temperature of that cell if the monolithic integrated circuit in which the cells are fabricated is a silicon-on-insulator (SOI) based monolithic integrated circuit chip such as those that are presently commercially available. Such an integrated circuit has the transistors or diodes therein fabricated in the thin-film silicon layer formed on the buried silicon dioxide layer that is supported on the bulk silicon substrate. Thus, memory cell structures 19 and 19' with the heat transfer resistant antiferromagnetic material ends 12 and 18' can be subsequently fabricated in effective vias provided in the electrical insulating material above those transistors or diodes which vias extend in that insulating material directly down to the corresponding cell current control selection transistors or diodes, or to locations closely adjacent thereto, thereby allowing the heat generated in those current control selection circuit device to flow directly to the corresponding memory cell structure.

Using such an SOI transistor for the current control selection transistor for the corresponding memory cell structure formed in an effective via in the insulating material above that transistor so that the cell structure is supported on the drain or source of that transistor, the heat transfer resistant antiferromagnetic material end 18' is still at approximately the temperature of the chip substrate upon this transistor being switched to establish current therethrough and through the cell. On the other hand, the temperature of the heat transfer resistant antiferromagnetic material end 12 rises significantly above the temperature of the chip substrate. Thus, the temperature of the corresponding memory cell structure can reach the critical temperature for the magnetic material of interest in the cell with relatively lower electrical current being drawn through that cell.

Figure 3A:
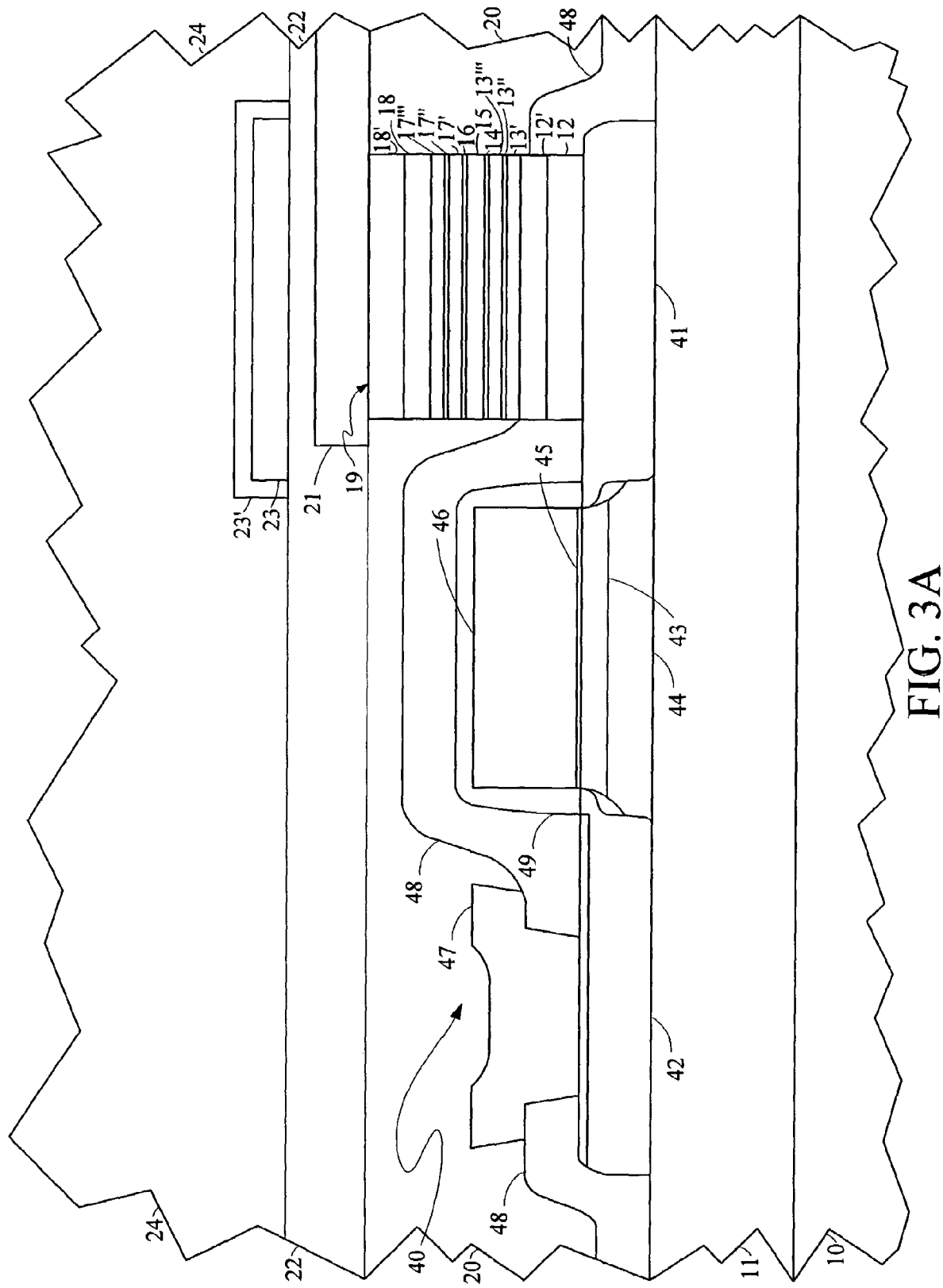
FIGS. 3A, 3B and 4 show layer diagrams of alternative memory cells and cell operation configurations in an integrated circuit cell control configuration.
Figure 3B:
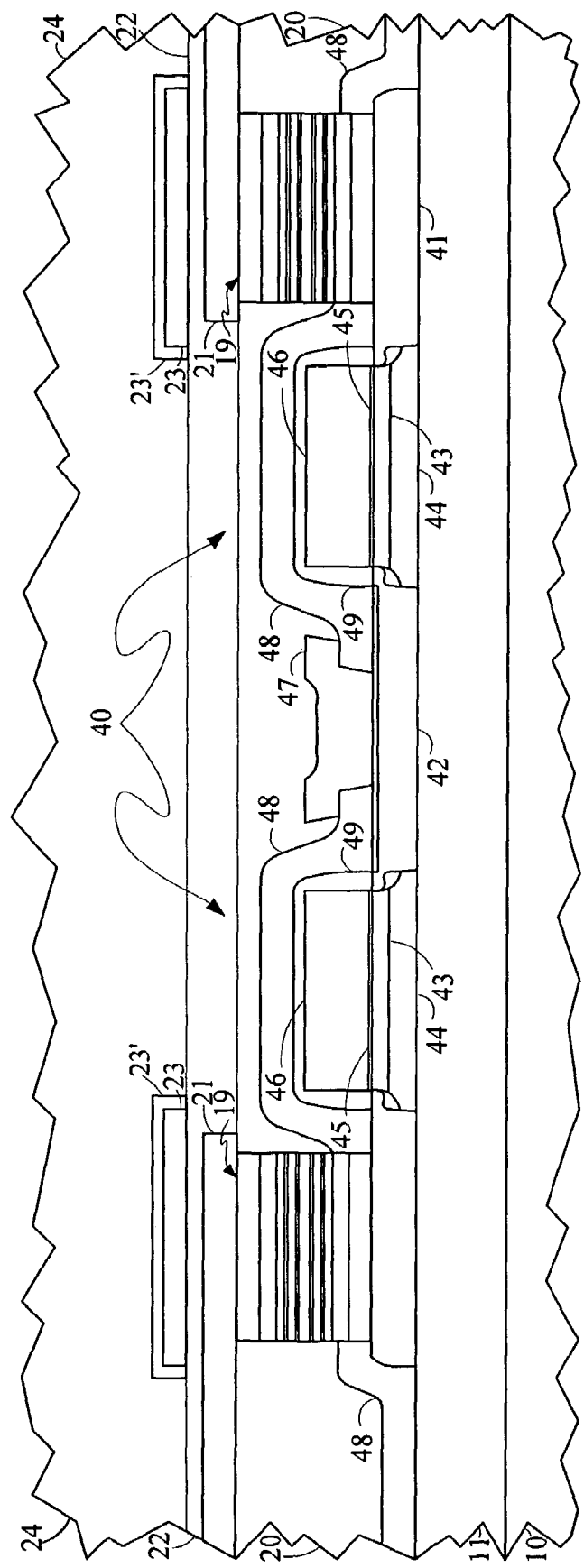
Figure 4:
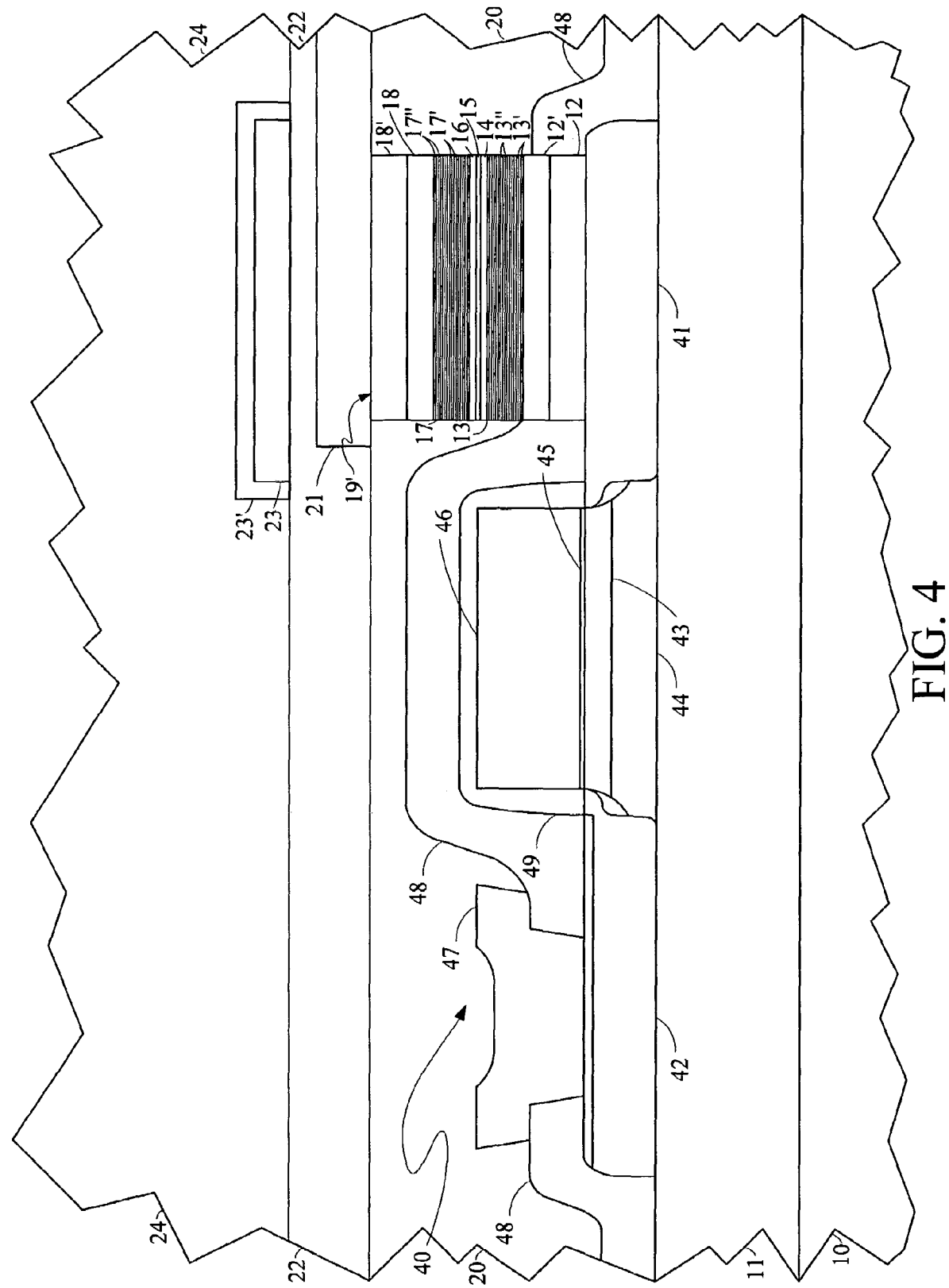
Figure 5:
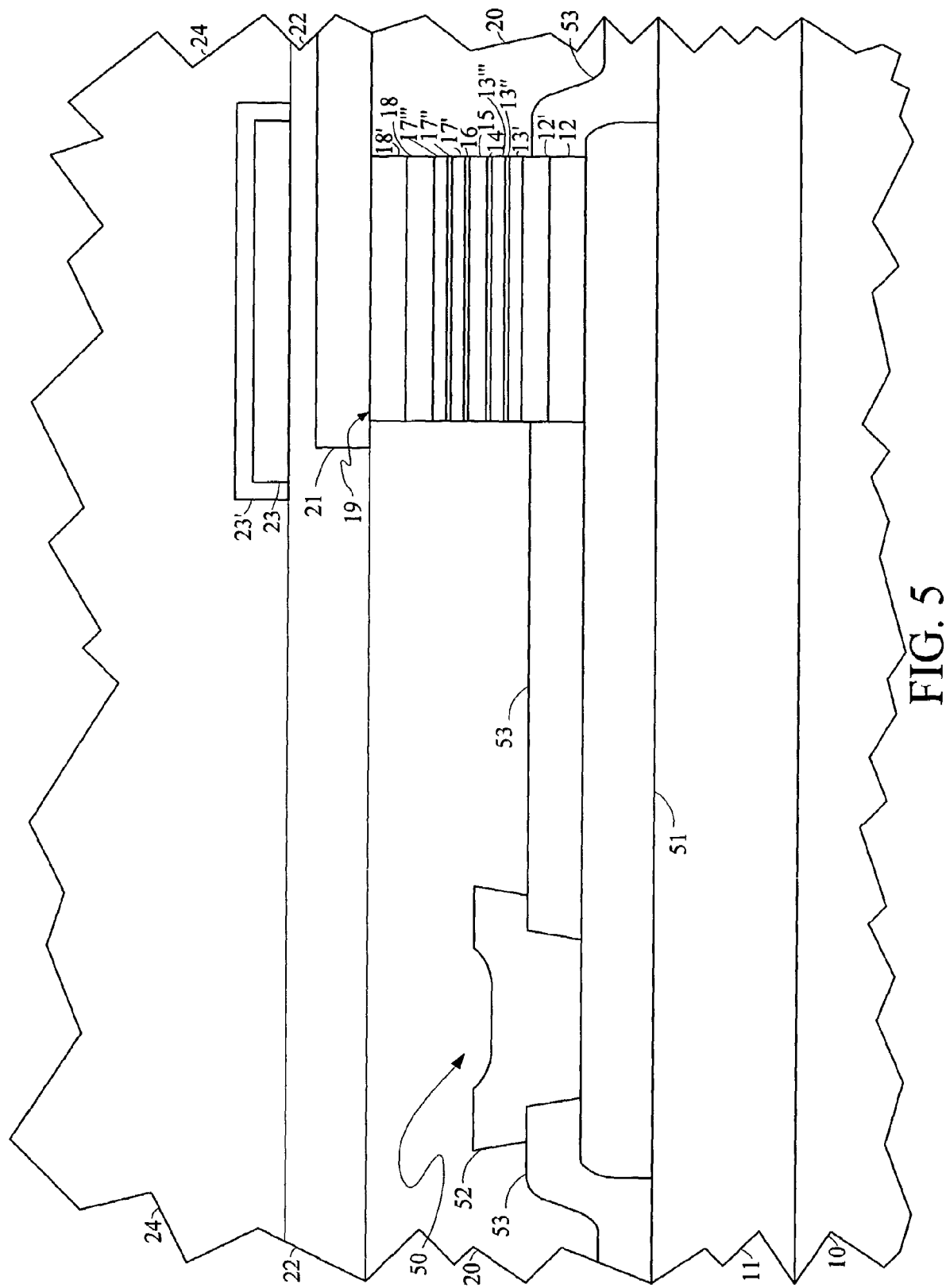
FIGS. 5 and 6 show layer diagrams of alternative memory cells in an alternative integrated circuit cell control configuration.
Figure 6:
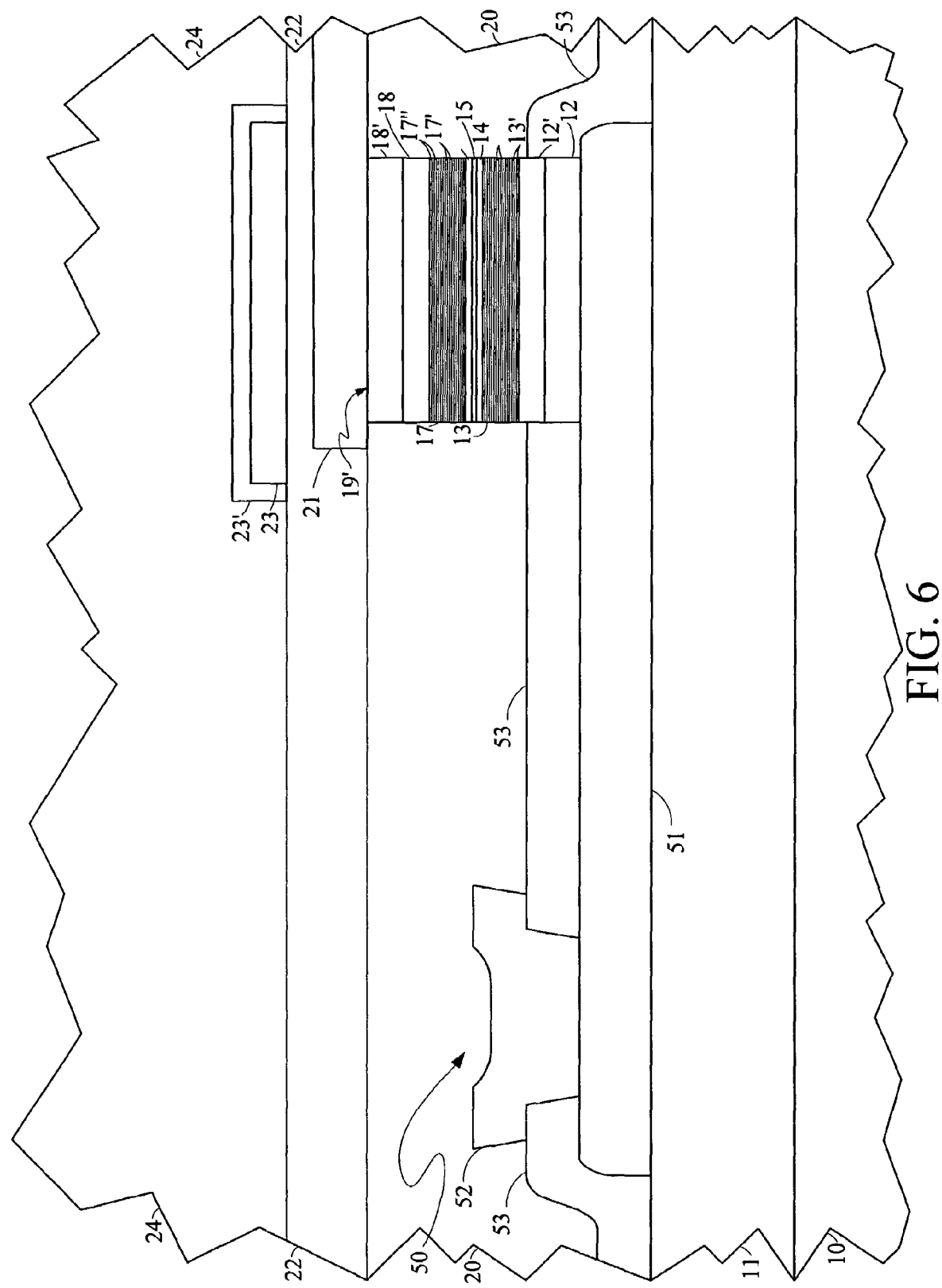

FIGS. 3 and 4 show the result of providing memory cell structures 19 and 19' of FIGS. 1 and 2, respectively, on the drain (or alternatively the source in a different SOI arrangement) of a n-channel metal-oxide-silicon field-effect partially depleted SOI transistor (NMOS transistor), 40, in fragmentary layer diagrams (again not to scale) representing a SOI monolithic integrated circuit. FIGS. 3A and 3B show alternative operational control arrangements for operating memory cell structures 19 in using one transistor 40 in the control and operation of each corresponding memory cell structure 19 in FIG. 3A, and using a pair of merged transistors 40 sharing a common source with one another to have one of a pair of memory cell structures 19 on a corresponding one of the two drains in that merged transistor pair to thereby increase the surface packing density of memory cell structures 19. The same numerical designations are used for structures in FIGS. 3A, 3B and 4 as were used for similar structures in FIGS. 1 and 2 in connection with memory cell structures 19 and 19', and for the associated interconnections and adjacent word line conductive interconnections which are provided on the remainder of the SOI monolithic integrated circuit serving as a substrate therefor, and for the merged transistors in FIG. 3B with respect to the single transistor in FIG. 3A. In addition, the bulk silicon substrate in the SOI monolithic integrated circuit has again been designated 10 even though it is not of itself a monolithic integrated circuit, and the buried oxide layer in the SOI monolithic integrated circuit has again been designated 11 since it is the insulator base supporting memory cell structures 19 and 19' (and, here, also the remaining circuitry in the SOI monolithic integrated circuit).

NMOS transistor 40 has this n-type conductivity drain, 41, thereof (merged transistor pair 40 in FIG. 3B have the corresponding ones of the pair of n-type conductivity drains 41) formed in the silicon thin-film layer provided on buried oxide layer 11 as is its n-type conductivity source, 42 (as is the common source 42 of merged transistor pair 40 in FIG. 3B). The remaining portion of the silicon thin-film layer between them has (the remaining portions of the silicon thin-film layer between merged source 42 and each of drains 41 in FIG. 3B each has) a p-type conductivity channel region, 43, over a p$^+$-type conductivity body region, 44, and under a gate oxide layer, 45. An n$^+$-type conductivity polycrystalline silicon base, 46, is provided as a transistor gate on gate oxide layer 45 (as a corresponding transistor gate on each of gate oxide layers 45 in FIG. 3B) to allow selecting between the "on" and "off" switching states of transistor 40 (each of merged transistors 40 independently in FIG. 3B) under the control of further circuitry not shown in this fragment of the SOI monolithic integrated circuit. This circuitry has gate 46 (gates 46 in FIG. 3B) connected thereto through extensions of the gate base material serving as circuit interconnections.

Thus, interconnection 21 is (interconnections 21 in FIG. 3B are) switchable to a source of positive voltage and, if done, provides that voltage to memory cell structures 19 and 19' on drain 41 (to memory cell structures 19 on corresponding ones of drains 41) so that a control signal to gate 46 can cause transistor 40 (a control signal to either one of gates 46 in merged transistor 40 can independently cause the corresponding one of merged transistors 46) to be switched into its "on" state which allows current to be drawn through memory cell structures 19 and 19' and through transistor 40 (at least a portion of merged transistor 40 in FIG. 3B) out through a source contact, 47, to a lower voltage potential point in the circuit connected to interconnection 47 thereby causing heating of both the corresponding cell and transistor (transistor portion in FIG. 3B). Pairs of memory cell structures 19' can be provided on the drains a merged transistor like merged transistor 40 to increase surface packing density thereof just as memory cell structures 19 are in FIG. 3B, and this is also possible for other memory cell structures provided on individual transistors described hereafter.

Interconnection 47 and memory cell structures 19 and 19' both extend through corresponding vias in an oxide insulating layer, 48, in FIGS. 3 and 4, respectively, to be in contact with transistor 40 which oxide layer is also about the insulating sidewall spacers positioned about gate 46 which are used in providing low doped drain and source regions adjacent channel region 43. Commonly, body region 44 is connected to source 42 or another source of bias voltage (neither being shown here) to control back bias effects of that body region.

Upon completing the sputter depositions over the via opening in oxide layer 48 to drain 41 of transistor 40 including, finally, (a) the second intermediate layer provided by spin dependent tunneling layer or barrier layer 16, and then compound ferromagnetic layer 17, magnetic "pinning" via layer 18 and thermal resistance control and magnetic "pinning" via layer 18' thereon for memory cell structure 19 shown in FIG. 3 just as for that structure in FIG. 1, or alternatively including in that layers sequence, finally, (b) the via alternating layers sequence 17 and the lower Néel temperature antiferromagnet formed by magnetic "pinning" via layer 18 and thermal resistance control and magnetic "pinning" via layer 18' thereon for memory cell structure 19' shown in FIG. 4, just as for that structure in FIG. 2, a further layer (not seen in FIGS. 1 and 2) is deposited on layer 18' to provide an etching termination layer, or stop, for subsequent etching steps. A milling mask layer is next sputter deposited on the etch stop layer to there be prepared for use as a milling mask by being suitably patterned using standard techniques. This last masking pattern is to result, after milling therethrough to remove the exposed ferromagnetic, antiferromagnetic and nonmagnetic layers therebelow, in the structures shown in FIGS. 3 and 4 to serve as portions of the corresponding memory cell double spin dependent tunneling structures and the vertical spin valve structures, respectively, of those figures.

Electrical insulating material layer 20 on oxide insulating layer 48, also surrounding the remaining exposed portions of interconnection 47 and memory cell structures 19 and 19' above oxide 48, can again be of organic materials such as polyimide or BCB which have thermal conductivities below those of commonly used electrical insulating materials in monolithic integrated circuits such as silicon dioxide or silicon nitride. Those remaining interconnection and "keeper" structures provided above cell structures 19 and 19' in the vias of oxide layer 48 and insulating material 20 in FIGS. 1 and 2 are provided in FIGS. 3 and 4 as they are in FIGS. 1 and 2. Memory cell double spin dependent tunneling structure 19 of FIG. 1 is thus replicated on drain 41 of transistor 40 in FIG. 3A (or a pair of them are thus replicated on a corresponding one of drains 41 of merged transistor 40 in FIG. 3B), and memory cell multilayer vertical spin valve structure 19' of FIG. 2 is replicated on drain 41 of transistor 40 in FIG. 4. Because of the positioning of memory cell double spin dependent tunneling structure 19 of FIG. 1 on drain 41 of controllable transistor 40 in FIG. 3A (or on drains 41 of controllable merged transistor 40 in FIG. 3B), and of memory cell multilayer vertical spin valve structure 19' of FIG. 2 on drain 41 of controllable transistor 40 in FIG. 4, heat resistant antiferromagnetic material end 12 is a layer which could be omitted in each of these memory cell structures.

Alternative to using a transistor in a SOI monolithic integrated circuit to provide current control and cell selection as done in FIGS. 3 and 4, FIGS. 5 and 6 show the use in a SOI monolithic integrated circuit of a Schottky barrier diode, 50, in series with memory cell structures 19 and 19', respectively, to thereby limit currents in these structures to being established in one direction only. Such an arrangement, in conjunction with circuit switching provided by SOI transistors elsewhere in the SOI monolithic integrated circuit (not shown), again allows selectively establishing current in the corresponding memory cell structure, and further allows the heat generated in the associated diode in doing so to conductively reach that memory cell structure to aid in raising the temperature thereof.

Schottky barrier diode 50 is formed following the etching of the thin-film silicon layer that has been initially provided on buried oxide layer 11 (lightly doped to have a n-type conductivity) to thereby provide a remaining layer portion, 51, that serves as the cathode of that diode. The diode anode is provided by an aluminum interconnection contact, 52. Silicon thin-film portion 51 also supports, towards its opposite end, memory cell structures 19 and 19' in FIGS. 5 and 6, respectively. Interconnection 52 and memory cell structures 19 and 19' both extend through vias in an oxide insulating layer, 53, in FIGS. 5 and 6, respectively, to be in contact with thin-film portion 51. The much higher thermal conductivity of thin-film portion 51 assures that the heat generated in diode 50 as a result of electrical current being drawn therethrough reaches the corresponding memory cell structure. Electrical insulating material layer 20 here, too, on oxide insulating layer 53, also surrounding the remaining exposed portions of interconnections 52 and memory cell structures 19 and 19' above oxide 53, can be of organic materials such as polyimide or BCB which have thermal conductivities below those of commonly used electrical insulating materials in monolithic integrated circuits such as silicon dioxide or silicon nitride. Those remaining interconnection and "keeper" structures provided above cell structures 19 and 19' in the vias of oxide layer 53 and insulating material 20 in FIGS. 1 and 2 are provided in FIGS. 5 and 6 as they are in FIGS. 1 and 2.

SOI transistors in SOI monolithic integrated circuit chips are to some extent thermally isolated from the bulk silicon substrate by the thin buried layer of primarily silicon oxide. Self heating of SOI devices has been known to cause a 50° C. thermal rise in the device above the bulk substrate commonly, and a 100° C. rise is not uncommon. By its nature, silicon dioxide is approximately one hundred times more thermally resistive than is silicon. The thickness of the thin-film silicon layer on the buried oxide layer and the width of a transistor or diode formed in and on remaining portions of that thin-film layer are of the same length scale as is the thickness of that buried oxide layer supported on the bulk silicon substrate. Thus, any heat generated in a transistor or diode formed in and on the thin-film silicon layer flows primarily through the thin-film silicon transistor or diode layer to the metal contract or contacts thereto, which act more or less as "heat sinks" due to the high thermal conductivity of metals (copper or aluminum), the thermal conductivity of which is even greater than that of silicon.

The following table lists the thermal conductivity and thermal diffusivity for silicon, silicon dioxide, and aluminum.

| Material | Thermal Conductivity (w/cm-K) | Thermal Diffusivity (cm$^2$/s) |
| --- | --- | --- |
| Silicon (bulk) | 1.48 | 0.635 |
| Silicon Dioxide | 0.0138 | 0.006 |
| Aluminum | 2.37 | 0.98 |

The value listed for silicon is a bulk value, and heavily doped silicon can have a higher thermal conductivity (5), but even that silicon has a much higher (~10 times) thermal conductivity than silicon dioxide. Thus, generated heat flows in SOI transistors and diodes are essentially parallel to the plane of the buried oxide layer through the thin-film silicon layer out to the electrical contacts thereto so that heat dissipation in transistor 40 in FIGS. 3 and 4 will be primarily through source interconnection contact 47, but in part through cell structures 19 and 19', and heat dissipation in diode 50 in FIGS. 5 and 6 will be primarily through anode interconnection contact 52 but again in part through cell structures 19 and 19'.

Smaller SOI devices will heat and cool more rapidly than larger ones. For nearly linear heat flows, an approximation for a thermal flow time constant τ is given by:

$$\tau = L^2/2D,$$

where L is the length in cm and D is thermal diffusivity. As an example using a length of 0.5 micron (or $0.5 \cdot 10^{-4}$ cm), and using a thermal diffusivity of 0.635 cm$^2$/second, the value of τ would be about 4 ns. Thus, for small monolithic integrated circuit devices, the associated thermal time constants can be of very short durations which then are suitable for a integrated circuit digital data memories.

To take advantage of such temperature increases in the storing of data, the heat flow generated in operating a memory cell structure could simply be reduced along the path from the memory cell structure down to the substrate thereby reducing the amount of power (and current) required to be dissipated between the cell opposite ends in the vias. The bulk silicon substrate can be at any temperatures occurring within the operating temperature range of the memory chip, and a current source tracking that temperature must provide sufficient current for the memory cell structure to heat to the critical ordering temperature of the magnetic material therein of interest for storing data considering the thermal characteristics of the materials in proximity to that material, the geometry of the memory cell structure, the thermal nature of the materials used at opposite ends of the cells in the cell structure, and the SOI device structures. If a maximum total temperature change of 200° C. is required, and if without the SOI device heating, half of the heat goes up and half down, then approximately ½ of 50/200 or 12.5% of the power required without the SOI device heating would be saved. With an active device temperature of 200° C., the power required would be halved.

By controlling the source-drain voltage and gate voltage on the current control selection SOI transistor associated with a memory cell structure, the SOI transistor can dissipate more or less power. With a relatively high source-drain voltage and a low gate voltage (but sufficient to switch the transistor on), the power dissipated in the transistor would be high, and this is the best condition for reaching the relevant magnetic material temperature in the cell used in storing data in that cell. With proper design, a feedback scheme could be used to insure that the right values of source-drain voltage and gate voltage would give a fixed value of temperature (such as 125 C) regardless of the bulk silicon substrate temperature. Further, with a high gate voltage and a lower source-drain voltage, a smaller data retrieval current could be used with relatively smaller SOI transistor dissipation.

Alternative to the arrangement shown for word line 23 in FIGS. 3, 4, 5 and 6, memory cell structures 19 and 19' can be arranged with word lines 23 also carrying the sensing and thermal generation electrical currents through being directly in contact with those cell structures. This further allows for the word line cladding 23' at each cell structure to be extended downward to be about corresponding sides of the associated cell structure to thereby reduce fringing in the magnetic fields generated by electrical currents established in the adjacent word line, and so reduce the electrical current in word line 23 needed to achieve a magnetic field therefrom of a selected intensity. Furthermore, the combining of the word lines with those carrying the sensing and thermal generation electrical currents allows an increase in the areal cell density across the monolithic integrated circuit chip. Thus, in FIGS. 7 and 8, the word line at the cell combined with the interconnection to the top of the cell, 21,23, is shown in solid line form where this interconnection is in electrical and physical contact with the cell and also shown with an extension thereof rearward and then to the right with the portion to the right being shown in dashed line form. Downward extended cladding, 23", is seen to provide a much more closely defined magnetic path about the memory cell structure. Insulating layer 24 in FIGS. 3, 4, 5 and 6 is no longer needed to protect cladded word lines 23 in FIGS. 7 and 8 which is accomplished with insulating layer 22 alone, and so is not shown in these latter figures.

Figure 7:
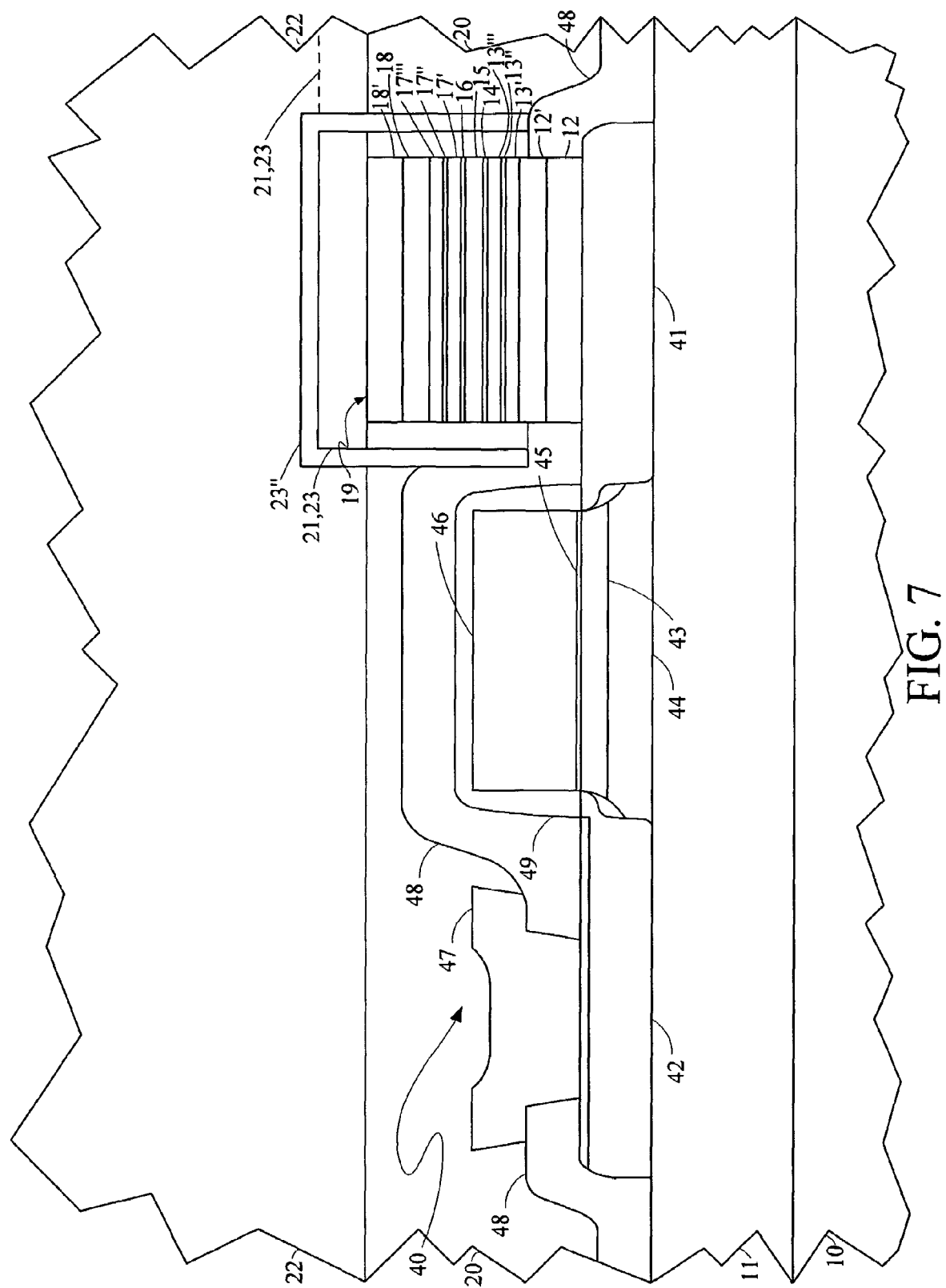
FIGS. 7 and 8 show layer diagrams of alternative memory cells in an alternative integrated circuit cell control configuration.
Figure 8:
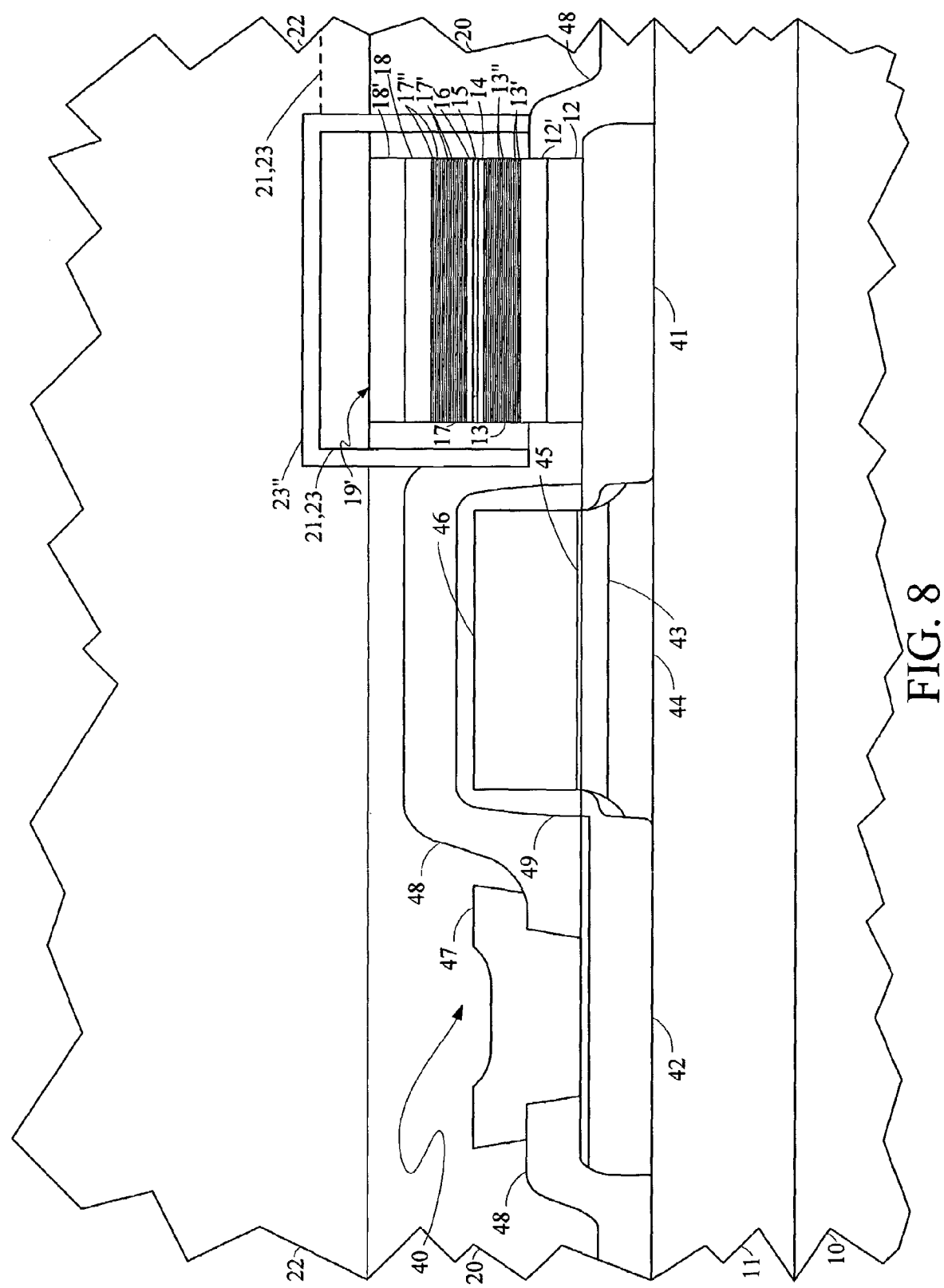

If the cladding material is an electrical insulator and a poor thermal conductor, then no insulating spacing between the cladding and the cell would be needed. In the more usual situation in which the cladding material is either a good electrical or thermal conducting ferromagnetic material, or both, an insulating spacing layer would be required as shown in FIGS. 7 and 8. The fabrication process can be accomplished in a similar manner to the spacer dot process used in integrated circuit production. First form the cell structure layers stack including the thermal flow control materials at the opposite ends thereof. Then coat the stack with an insulator, polish the insulator back to allow electrical and physical contact to the stack, and form the word line with cladding on top. The word line must be oversized with respect to the cell structure to allow for insulation from the cladded edge of the word line to the edge of the stack. Then etch down vertically using the word line as a mask. The cladding on top may have to be thick to allow for etching of the cladding at this step. Then deposit cladding material uniformly on the substrate. Then etch down vertically to remove the newly deposited cladding material except near the edges of the stack.

Figure 9:
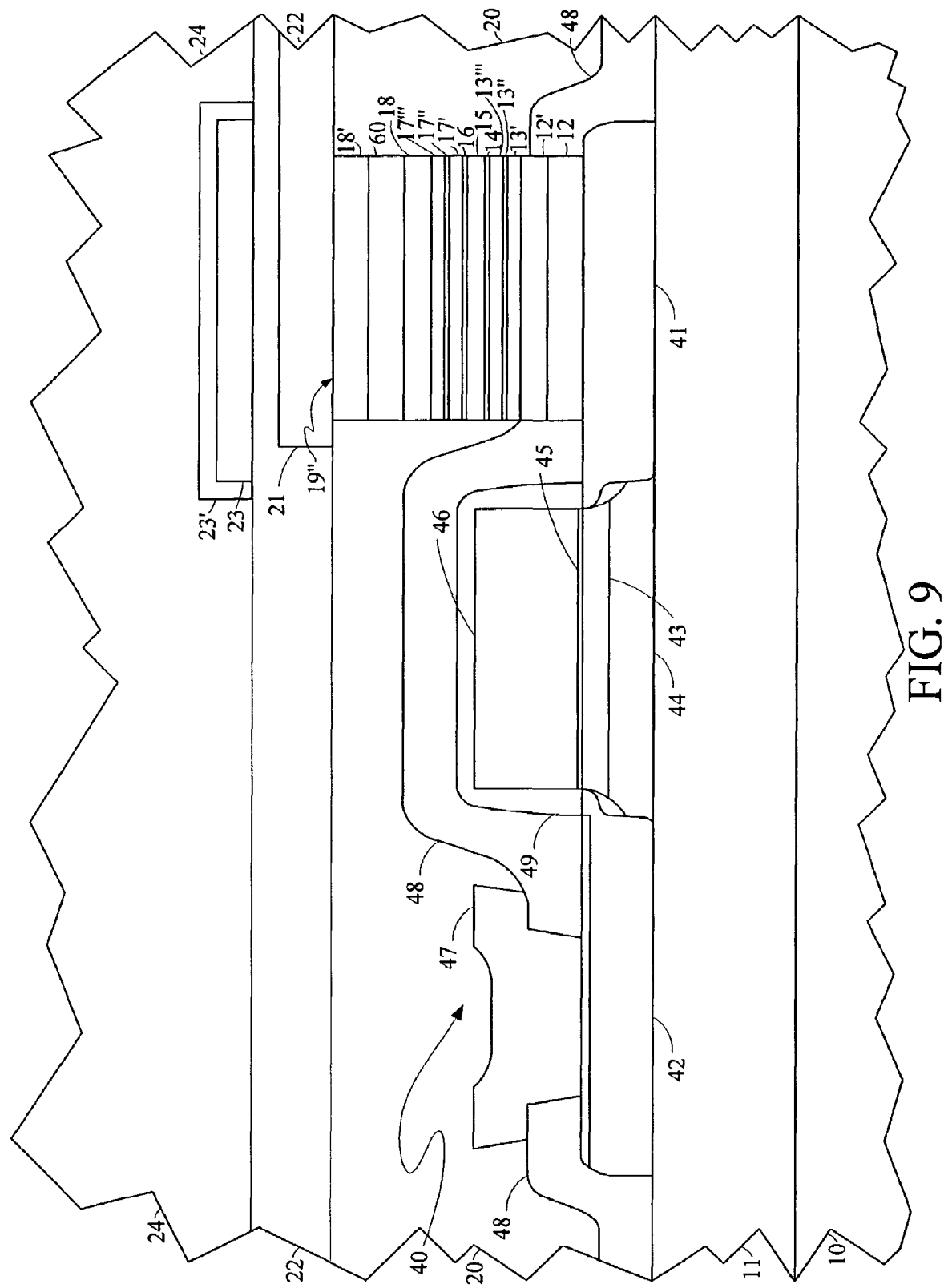
FIGS. 9 and 10 show layer diagrams of further alternative memory cells in an integrated circuit cell control configuration.
Figure 10:
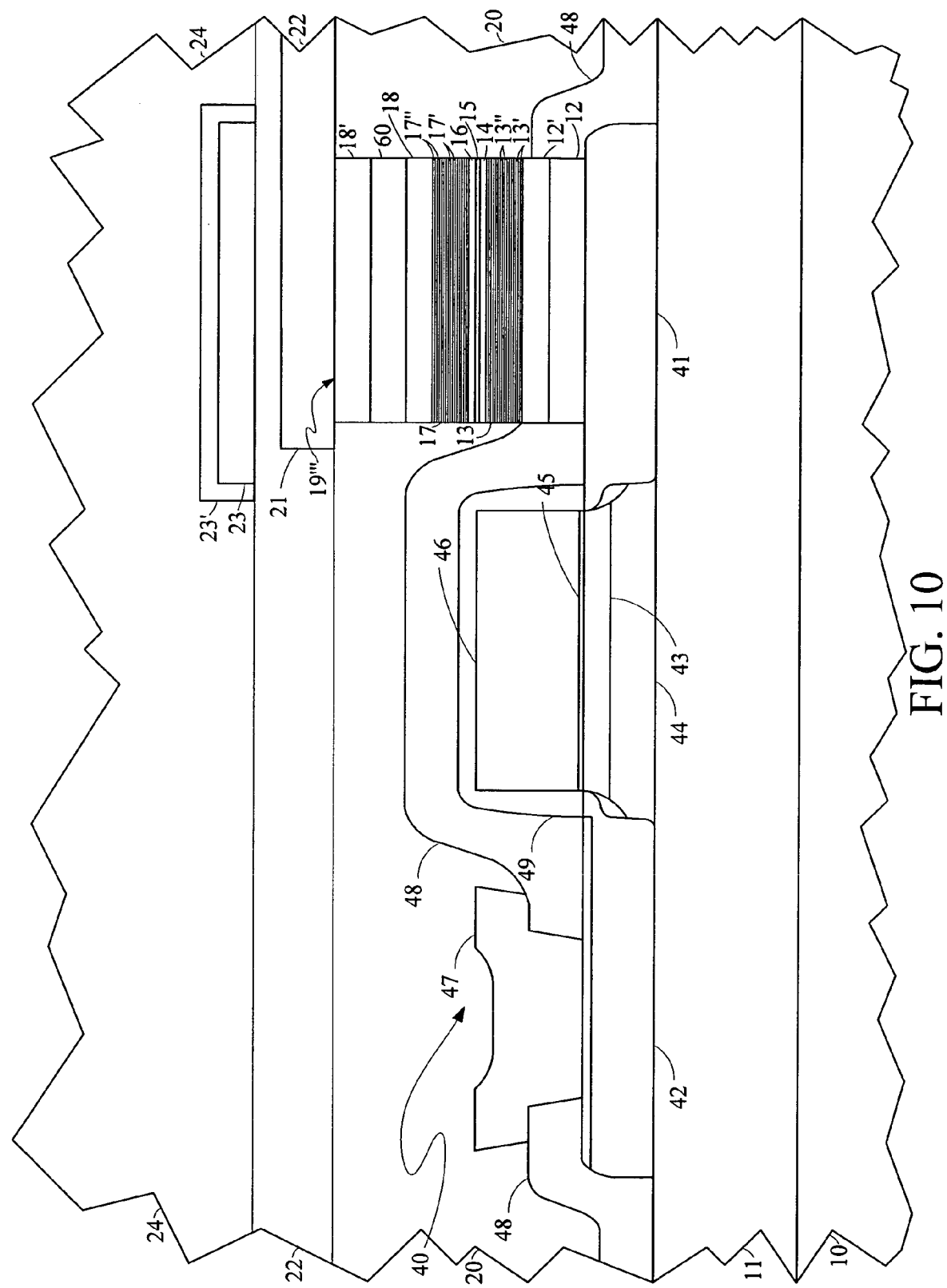

In a further structural supplemental cell heat generating arrangement, a thermistor is provided as a sputtered layer within the memory cell structures 19 and 19' shown in FIGS. 1, 2, 3, 4, 5 and 6 just below heat flow resistant antiferromagnetic material end 18' to be electrically in series with that cell in the figure. Such a thermistor layer in a memory cell structure can be provided to form memory cell structures in the monolithic integrated circuit chips shown in FIGS. 1 and 2 in which the current control selection transistors are formed in silicon substrate 10 therein. Alternatively, such a thermistor layer in a memory cell structure can be provided to form memory cell structures in vias in the insulating material about and above transistors or above and adjacent to the diodes formed with portions of the silicon thin-film layer provided on the buried oxide layer in a SOI monolithic integrated circuit chip. As examples, a thermistor layer, 60, is shown in FIGS. 9 and 10 in a pair of modified memory cell structures, 19" and 19''', provided in SOI monolithic integrated circuit chips using SOI transistors 40 in FIGS. 7 and 8, respectively.

A thermistor material has low electrical resistance at relatively lower temperatures and much higher electrical resistance at sufficiently higher temperatures. Cell currents for cell data retrieval are chosen sufficiently small to keep the temperature between the thermal flow control opposite cell ends provided by heat flow resistant antiferromagnetic material ends 12 and 18' in memory cell structures 19" and 19''' below the "knee" of the temperature versus resistance characteristic of thermistor material layers 60 therein. However, cell currents for cell data storage are chosen sufficiently large to keep the temperatures between the thermal control opposite cell ends for a selected time above the "knee" of the temperature vs resistance characteristic of the thermistor material layers 60 therein with the resulting much greater power dissipation significantly raising the temperature of the thermistor. Thus, the temperature of the memory cell structure in which the thermistor is present is also raised toward being above the critical temperature for the magnetic material of interest in that cell in connection with storing data therein. The sputtered material for the thermistor material layer deposited with the other layers used in forming cell structures 19" and 19''' is typically doped barium titanate ($BaTiO_3$) which is typically doped with a rare earth such as yttrium to 1%. Another alternative is barium strontium titanate which is a ferroelectric material as is barium titanate.

The grain boundaries in these materials are heavily doped, and below the Curie point of the ferroelectric, there are strong electric fields at the grain boundaries which make the material quite conductive. Above the Curie point, the electric fields disappear, and the materials becomes much more resistive. The Curie point can be adjusted with proper doping, with normal values about 100° C. The resistance then changes several orders of magnitude within a few tens of ° C.

A relatively high resistance provided between the two thermal vias in the memory cell structures is desirable for heating that cell during data storage. The heat generated is $I^2R$, where R is the total resistance between the opposite ends of the cell and I is the current supplied by the minimum-sized current control selection transistor needed to control that current. The maximum value of I is about 100 µA for such a transistor, and this is relatively independent of the ground rules used in the manufacture of the transistor. Thus, a high value series resistance greatly increases the power dissipated in the cell, and thereby increases the cell temperature to the storage magnetic material Curie point faster, or at a lower current, and with less voltage stress on the memory cell itself.

However, a large-value resistor added in series with the memory cell would reduce the effective signal from the cell, adding to the background resistance without increasing the change in resistance due to memory state. However, if this added resistance is small for currents used to interrogate the state of the cell, then the reduction can also be small. For example, if the series resistance is 10% of the background resistance of the cell, then the effective magnetoresistance of the cell is reduced by only 10% as well.

A series resistor with the properties of a thermistor satisfies both conditions, that is, low resistance in interrogation or data retrieval situations, and high resistance in data storage situations. Up to the thermistor Curie temperature, the thermistor material actually decreases slightly in resistivity. Thus, a typical reading current of about 10 mA should not heat the thermistor to 100° C., and the extra series resistance should be small. A current source (switched fully on) delivering 100 mA causes the temperature of the thermistor to start to rise above the Curie point of the thermistor material. The time to reach the operating temperature depends on many factors, including current source characteristics and dynamics, the thermal parameters of the cell, and thermistor characteristics. At higher temperatures, the memory cell structure resistance can be ignored. When the load line due to the resistance of the thermistor intersects the operating characteristic of the current source switched fully on, the product of the current and voltage across the thermistor should be at the power value P needed to reach the Curie (Néel) temperature of the magnetic material layer of interest in storing the data in the memory cell structure. The resistance value of the thermistor should also be the value of an equivalent resistor R at the operating temperature to give the R value needed using this current source at the Curie/Néel temperature of the magnetic material layer of interest in storing the data in the memory cell structure.

In general, if V is the equivalent voltage of the current source and Rc is the equivalent resistance of the current source, and ignoring the cell resistance, then the following relationship would hold:

$$V^2 Rs/(Rs+Rc)^2 = P,$$

where Rs is the thermistor resistance. Knowing the thermal characteristics of the thermistor material, the size of the thermistor can be designed to give the right power dissipation for a selected operating current source. The only additional design constraint would be that Rs be small with respect to the memory cell structure resistance at the maximum data retrieval temperature.

Thus, use of thermistor layer 60 in memory cells such as cells 19″ and 19‴ can provide in
1) higher heating without significant sacrifice of signal,
2) less voltage stress at high temperature for the memory cell structure which is especially important for tunneling cells,
3) the possibility of using just one junction rather that stacked junctions for tunneling cells and allowing somewhat higher cell resistance-area products, and
4) greatly reduced need for increases in resistance in the multilayer spin valve cell.

Although the present invention has been described with reference to preferred embodiments, workers skilled in the art will recognize that changes may be made in form and detail without departing from the spirit and scope of the invention.

The invention claimed is:

1. A ferromagnetic material thin-film based digital memory, said memory comprising:
a substrate formed of a base supporting an electrically insulating material primary substrate layer;
a plurality of current control devices, each supported on said primary substrate layer and having an interconnection structure portion extending substantially parallel to said primary substrate layer with each of said plurality of current control devices being separated from one another by spacer material therebetween, said plurality of current control devices being electrically interconnected with information storage and retrieval circuitry,
a plurality of bit structures, each supported on and electrically connected to a said interconnection structure portion of a corresponding one of said plurality of current control devices and separated from one another by a spacer material therebetween, said bit structures each comprising a first magnetic material film in which a characteristic magnetic property is substantially maintained below a first critical temperature above which such magnetic property is not maintained and a second magnetic material film in which a characteristic magnetic property is substantially maintained below a second critical temperature above which such magnetic property is not maintained, and with said second magnetic material film being separated from said first magnetic material film by at least one intermediate layer of a nonmagnetic material having two major surfaces on opposite sides thereof; and
a plurality of word line structures each having a pair of word line end terminal regions adapted to conduct electrical current in at least one direction therethrough, each of said pairs of word line end terminal regions having an electrical conductor electrically connected therebetween which is located on an opposite side of said intermediate layer of a corresponding one of said bit structures from said interconnection structure portion providing support thereto, said information storage and retrieval circuitry for drawing a sufficient electrical current selectively through each said bit structure, that said interconnection structure portion providing support thereto and that said one of said plurality of current control devices from which that said interconnection structure portion extends to cause substantial heating of that said bit structure to thereby raise temperatures thereof to have at least one of said first and second magnetic material films therein at least approach its corresponding one of said first and second critical temperatures while being substantially above temperatures of at least an adjacent said bit structure because of sufficient extent of, and smallness of thermal conductivities of, at least portions of said selected bit structure and of those portions of said primary substrate layer and said spacer material positioned thereabout.

2. The device of claim 1 wherein said plurality of word line structures each has said electrical conductor therein located across said bit structure adjacent spacer material from said corresponding one of said bit structures, and wherein each of said bit structures has a first interconnection structure providing electrical contact thereto positioned against a first contact surface thereof substantially parallel to said intermediate layer major surfaces located on an opposite side of said intermediate layer therein from said interconnection structure portion.

3. The device of claim 2 further comprising said plurality of bit structures each having a relatively high thermal resistance material layer located between said intermediate layer and said interconnection structure portion which has a thermal diffusivity less than that of said interconnection structure portion, and another relatively high thermal resistance material layer located between said intermediate layer and said first interconnection structure which has a thermal diffusivity less than that of said first interconnection structure.

4. The device of claim 3 wherein said intermediate layer is formed from an electrically insulative material.

5. The device of claim 4 wherein said intermediate layer is a first intermediate layer and further comprising a second intermediate layer of an electrically insulative material which is separated from said first intermediate layer by a separating magnetic material layer, said first and second intermediate layers each having an antiferromagnet on a side thereof opposite that closest to said separating magnetic material layer.

6. The device of claim 3 wherein said intermediate layer is formed from an electrically conductive material.

7. The device of claim 6 wherein said intermediate layer contains a porous metal layer portion, and has on each side thereof an antiferromagnet which loses its antiferromagnetic behavior at elevated temperatures differing from one another.

8. The device of claim 3 further comprising a layer of thermistor material provided between said two relatively high thermal resistance material layers.

9. The device of claim 1 wherein said plurality of word line structures each has said electrical conductor therein providing electrical contact to said corresponding one of said bit structures through being against a first contact surface thereof substantially parallel to said intermediate layer major surfaces located on an opposite side of said intermediate layer therein from said interconnection structure portion.

10. The device of claim 9 further comprising said plurality of bit structures each having a relatively high thermal resistance material layer located between said intermediate layer and said interconnection structure portion which has a thermal diffusivity less than that of said interconnection structure portion, and another relatively high thermal resistance material layer located between said intermediate layer and said corresponding word line electrical conductor providing electrical contact thereto which has a thermal diffusivity less than that of that said corresponding word line electrical conductor.

11. The device of claim 10 wherein said intermediate layer is formed from an electrically insulative material.

12. The device of claim 11 wherein said intermediate layer is a first intermediate layer and further comprising a second intermediate layer of an electrically insulative material which is separated from said first intermediate layer by a separating magnetic material layer, said first and second intermediate layers each having an antiferromagnet on a side thereof opposite that closest to said separating magnetic material layer.

13. The device of claim 10 wherein said intermediate layer is formed from an electrically conductive material.

14. The device of claim 13 wherein said intermediate layer contains a porous metal layer portion, and has on each side thereof an antiferromagnet which loses its antiferromagnetic behavior at elevated temperatures differing from one another.

15. The device of claim 10 further comprising a layer of thermistor material provided between said two relatively high thermal resistance material layers.

16. The device of claim 9 further comprising said plurality of word line structures each having said electrical conductor therein providing electrical contact to said corresponding one of said bit structures has at least one side thereof cladded with a magnetically permeable material.

17. The device of claim 16 further comprising said magnetically permeable material extending from where cladding a said electrical conductor corresponding to one of said bit structures to being positioned across from opposite edges of said intermediate layer in that said bit structure.

18. The device of claim 1 further comprising said plurality of bit structures each having a relatively high thermal resistance material layer located between said intermediate layer and said first interconnection structure which has a thermal diffusivity less than that of said interconnection structure portion.

19. The device of claim 18 wherein said relatively high thermal resistance material layer also is antiferromagnetic.

20. The device of claim 1 wherein said intermediate layer is formed from an electrically insulative material.

21. The device of claim 20 wherein said intermediate layer is a first intermediate layer and further comprising a second intermediate layer of an electrically insulative material which is separated from said first intermediate layer by a separating magnetic material layer, said first and second intermediate layers each having an antiferromagnet on a side thereof opposite that closest to said separating magnetic material layer.

22. The device of claim 1 wherein said intermediate layer is formed from an electrically conductive material.

23. The device of claim 22 wherein said intermediate layer contains a porous metal layer portion, and has on each side thereof an antiferromagnet which loses its antiferromagnetic behavior at elevated temperatures differing from one another.

24. The device of claim 1 wherein said plurality of current control devices are each a transistor.

25. The device of claim 1 wherein said plurality of current control devices are each a diode.

26. The device of claim 1 wherein said plurality of current control devices has pairs thereof each sharing a structure portion thereof in common with one another.

27. A ferromagnetic thin-film based digital memory, said memory comprising:
   a substrate formed of a base supporting an electrically insulating material primary substrate layer;
   a plurality of current control devices, each supported on said primary substrate layer with each of said plurality of current control devices being separated from one another by spacer material therebetween, said plurality of current control devices being electrically interconnected with information storage and retrieval circuitry,
   a plurality of support layer portions each supported on said primary support layer and electrically interconnected with a corresponding one of said plurality of current control devices,
   a plurality of bit structures, each supported on and electrically connected to a said support layer portion and separated from one another by a spacer material therebetween, said bit structures each comprising a first magnetic material film in which a characteristic magnetic property is substantially maintained below a first critical temperature above which such magnetic property is not maintained and a second magnetic material film in which a characteristic magnetic property is substantially maintained below a second critical temperature above which such magnetic property is not maintained, and with said second magnetic material film being separated from said first magnetic material film by at least one intermediate layer of a nonmagnetic material having two major surfaces on opposite sides thereof, and
   a plurality of word line structures each having a pair of word line end terminal regions adapted to conduct electrical current in at least one direction therethrough, each of said pairs of word line end terminal regions having an electrical conductor electrically connected therebetween which is located on an opposite side of said intermediate layer of a corresponding one of said bit structures from said support layer portion providing support thereto, said information storage and retrieval circuitry for drawing a sufficient electrical current selectively through each said bit structure, that said support layer portion providing support thereto and that said one of said plurality of current control devices from with which that said support layer portion is interconnected to cause substantial heating of that said bit structure to thereby raise temperatures thereof to have at least one of said first and second magnetic material films therein at least approach its corresponding one of said first and second critical temperatures while being substantially above temperatures of at least an adjacent said bit structure because of sufficient extent of, and smallness of thermal conductivities of, at least portions of said selected bit structure and of those portions of said primary substrate layer and said spacer material positioned thereabout.

* * * * *

UNITED STATES PATENT AND TRADEMARK OFFICE
CERTIFICATE OF CORRECTION

| | | |
|---|---|---|
| PATENT NO. | : 7,148,531 B2 | Page 1 of 1 |
| APPLICATION NO. | : 11/116874 | |
| DATED | : December 12, 2006 | |
| INVENTOR(S) | : James M. Daughton et al. | |

It is certified that error appears in the above-identified patent and that said Letters Patent is hereby corrected as shown below:

Column 1, Line 9, insert the following paragraph between Cross-Reference To Related Application paragraph and Background of the Invention:

--This invention was made with Government support under HDTRA1-04-C-0002 awarded by the Defense Threat Reduction Agency. The Government has certain rights in the invention.--

Signed and Sealed this

Twenty-second Day of July, 2008

JON W. DUDAS
*Director of the United States Patent and Trademark Office*